US012701703B2

(12) United States Patent
Choi et al.

(10) Patent No.: US 12,701,703 B2
(45) Date of Patent: Aug. 4, 2026

(54) SEMICONDUCTOR MEMORY DEVICE INCLUDING GATE ELECTRODES WITH INTERNAL VOIDS AND ELECTRONIC SYSTEM INCLUDING THE SAME

(71) Applicant: SAMSUNG ELECTRONICS CO., LTD., Suwon-si (KR)

(72) Inventors: Hyo Seok Choi, Hwaseong-si (KR); Kyoung Sun Kim, Suwon-si (KR); Hee Jeong Son, Gumi-si (KR); Min Ju Kang, Seoul (KR); Seong Joon Ahn, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 773 days.

(21) Appl. No.: 17/970,764

(22) Filed: Oct. 21, 2022

(65) Prior Publication Data

US 2023/0165000 A1      May 25, 2023

(30) Foreign Application Priority Data

Nov. 23, 2021      (KR) ........................ 10-2021-0162047

(51) Int. Cl.
| | |
|---|---|
| *H10B 43/27* | (2023.01) |
| *G11C 5/06* | (2006.01) |
| *G11C 16/04* | (2006.01) |
| *H10B 41/10* | (2023.01) |
| *H10B 41/27* | (2023.01) |
| *H10B 41/35* | (2023.01) |
| *H10B 41/40* | (2023.01) |
| *H10B 43/10* | (2023.01) |
| *H10B 43/35* | (2023.01) |
| *H10B 43/40* | (2023.01) |

(52) U.S. Cl.
CPC ............... *H10B 43/27* (2023.02); *G11C 5/06* (2013.01); *G11C 16/0483* (2013.01); *H10B 41/10* (2023.02); *H10B 41/27* (2023.02); *H10B 41/35* (2023.02); *H10B 41/40* (2023.02); *H10B 43/10* (2023.02); *H10B 43/35* (2023.02); *H10B 43/40* (2023.02)

(58) Field of Classification Search
CPC ........ H10B 43/27; H10B 41/10; H10B 43/35; H10B 41/35; H10B 41/40; H10B 43/40; H10B 43/10; H10B 41/27; G11C 5/06; G11C 16/0483
USPC ........................................................ 257/314
See application file for complete search history.

(56) References Cited

U.S. PATENT DOCUMENTS

| | | | |
|---|---|---|---|
| 8,912,591 B2 | 12/2014 | Baek et al. | |
| 9,953,997 B2 | 4/2018 | Park et al. | |
| 10,283,524 B1 * | 5/2019 | Greenlee | .............. H10D 62/292 |
| 10,403,638 B2 | 9/2019 | Lee et al. | |
| 10,566,346 B2 | 2/2020 | Lee et al. | |
| 10,770,473 B2 | 9/2020 | Lee et al. | |

(Continued)

*Primary Examiner* — Norman D Richards
*Assistant Examiner* — Colin Russell Mccutcheon
(74) *Attorney, Agent, or Firm* — Muir Patent Law, PLLC

(57) ABSTRACT

A semiconductor memory device includes a cell substrate including a cell array region and an extended region, gate electrodes stacked on the cell substrate, the gate electrodes including molybdenum, and channel structures in the cell array region, the channel structures penetrating the gate electrodes, wherein at least one of the gate electrodes includes at least one void in a region between the channel structures.

20 Claims, 22 Drawing Sheets

(56)        References Cited

U.S. PATENT DOCUMENTS

| 10,840,259 | B2 | 11/2020 | Rabkin et al. |
| 10,916,504 | B2 | 2/2021 | Mukae et al. |
| 2019/0244969 | A1* | 8/2019 | Lee ................... H01L 21/28568 |
| 2020/0013714 | A1* | 1/2020 | Lin ....................... H10D 84/811 |

\* cited by examiner

SEMICONDUCTOR MEMORY DEVICE INCLUDING GATE ELECTRODES WITH INTERNAL VOIDS AND ELECTRONIC SYSTEM INCLUDING THE SAME

CROSS-REFERENCE TO RELATED APPLICATION

This application claims priority under 35 U.S.C. § 119 from Korean Patent Application No. 10-2021-0162047, filed on Nov. 23, 2021, in the Korean Intellectual Property Office, the disclosure of which is incorporated herein by reference in its entirety.

BACKGROUND

1. Field

The present disclosure relates to a semiconductor device and an electronic system including the same.

2. Description of the Related Art

In an electronic system that requires data storage, a semiconductor device that may store a high capacity of data is required. Accordingly, measures that may increase the data storage capacity of the semiconductor device are being studied. For example, as one of the methods for increasing the data storage capacity of the semiconductor device, a semiconductor device including memory cells arranged three-dimensionally instead of memory cells arranged two-dimensionally is proposed.

SUMMARY

According to an embodiment, a semiconductor memory device may include a cell substrate which includes a cell array region and an extended region; a plurality of gate electrodes stacked on the cell substrate; and a plurality of channel structures which are disposed in the cell array region and penetrate the plurality of gate electrodes, wherein at least one of the plurality of gate electrodes between the plurality of channel structures includes at least one void which is an empty space located inside, and the plurality of gate electrodes include molybdenum.

According to an embodiment, a semiconductor memory device may include a cell substrate; a plurality of first gate electrodes which are stacked on the cell substrate and extend in a first direction; a plurality of second gate electrodes which are stacked on the plurality of first gate electrodes and extend in the first direction; a plurality of channel structures which penetrate the plurality of first and second gate electrodes; a plurality of block separation structures which penetrate the plurality of first and second gate electrodes, extend in the first direction, and are spaced apart from each other in a second direction different from the first direction; and at least one void which is an empty space located inside at least one of the plurality of first and second gate electrodes, wherein the plurality of first and second gate electrodes include molybdenum, the void is not placed on the first and second gate electrodes between the block separation structure and the channel structure adjacent to the block separation structure, and the void is placed on the first and second gate electrodes between the channel structures adjacent to each other.

According to an embodiment, an electronic system may include a main board; a semiconductor memory device on the main board; and a controller that is electrically connected to the semiconductor memory device on the main board, wherein the semiconductor memory device includes a first structure including a peripheral circuit, a second structure including an I/O connection wiring electrically connected to the peripheral circuit, and an I/O pad that is electrically connected to the I/O connection wiring extending into the second structure, wherein the second structure includes a cell substrate including a cell array region and an extended region, a plurality of gate electrodes stacked on the cell substrate, a plurality of channel structures which are placed disposed in the cell array region and penetrate the plurality of gate electrodes, and a block separation structure that penetrates the plurality of gate electrodes, wherein at least one of the plurality of gate electrodes between the plurality of channel structures includes at least one void that is an empty space located inside, and the plurality of gate electrodes between the block separation structure and the channel structure adjacent to the block separation structure do not include the void, and the plurality of gate electrodes include molybdenum.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
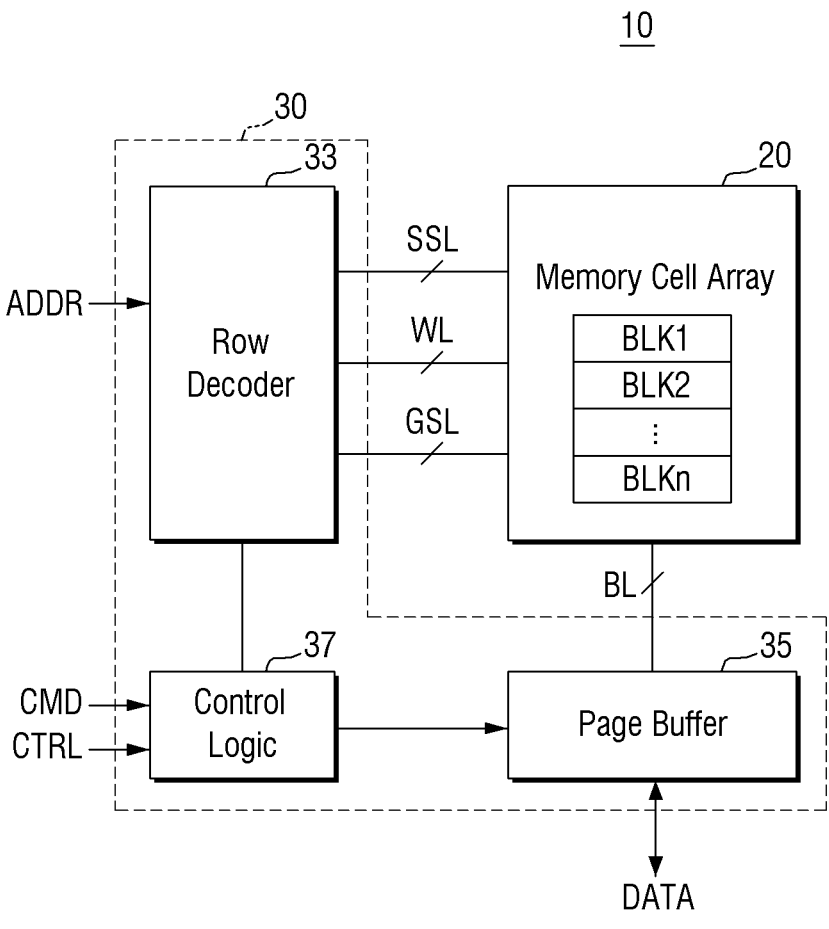
FIG. 1 is an exemplary block diagram of a semiconductor memory device according to some embodiments.

FIG. 1 is an exemplary block diagram of a semiconductor memory device according to some embodiments.

Referring to FIG. 1, a semiconductor memory device 10 according to some embodiments may include a memory cell array 20 and a peripheral circuit 30.

The memory cell array 20 may include a plurality of memory cell blocks BLK1 to BLKn. Each of the memory cell blocks BLK1 to BLKn may include a plurality of memory cells. The memory cell array 20 may be connected to the peripheral circuit 30 through a bit line BL, a word line WL, at least one string selection line SSL, and at least one ground selection line GSL. Specifically, the memory cell blocks BLK1 to BLKn may be connected to a row decoder 33 through the word line WL, the string selection line SSL, and the ground selection line GSL. Further, the memory cell blocks BLK1 to BLKn may be connected to a page buffer 35 through the bit line BL.

The peripheral circuit 30 may receive an address ADDR, a command CMD, and a control signal CTRL from the outside of the semiconductor memory device 10, and may transmit and receive data DATA to and from an external device of the semiconductor memory device 10. The peripheral circuit 30 may include a control logic 37, a row decoder 33, and a page buffer 35. Although not shown, the peripheral circuit 30 may further include various sub-circuits, e.g., an input/output circuit, a voltage generation circuit that generates various voltages necessary for the operation of the semiconductor memory device 10, and an error correction circuit for correcting error of the data DATA that is read from the memory cell array 20.

The control logic 37 may be connected to the row decoder 33, the input/output circuit, and the voltage generation circuit. The control logic 37 may control the overall operation of the semiconductor memory device 10. The control logic 37 may generate various internal control signals used inside the semiconductor memory device 10 in response to the control signal CTRL. For example, the control logic 37 may adjust the voltage levels provided to the word line WL and the bit line BL when performing a memory operation, e.g., a program operation or an erase operation.

The row decoder 33 may select at least one of the plurality of memory cell blocks BLK1 to BLKn in response to the address ADDR, and may select at least one word line WL, at least one string selection line SSL, and at least one ground selection line GSL of the selected memory cell blocks BLK1 to BLKn. Further, the row decoder 33 may transmit a voltage for performing the memory operation to the word line WL of the selected memory cell blocks BLK1 to BLKn.

The page buffer 35 may be connected to the memory cell array 20 through the bit line BL. The page buffer 35 may operate as a writer driver or a sense amplifier. Specifically, when the program operation is performed, the page buffer 35 may operate as the writer driver, and may apply a voltage corresponding to the data DATA to be stored in the memory cell array 20 to the bit line BL. When performing the read operation, the page buffer 35 may operate as a sense amplifier and sense the data DATA stored in the memory cell array 20.

Figure 2:
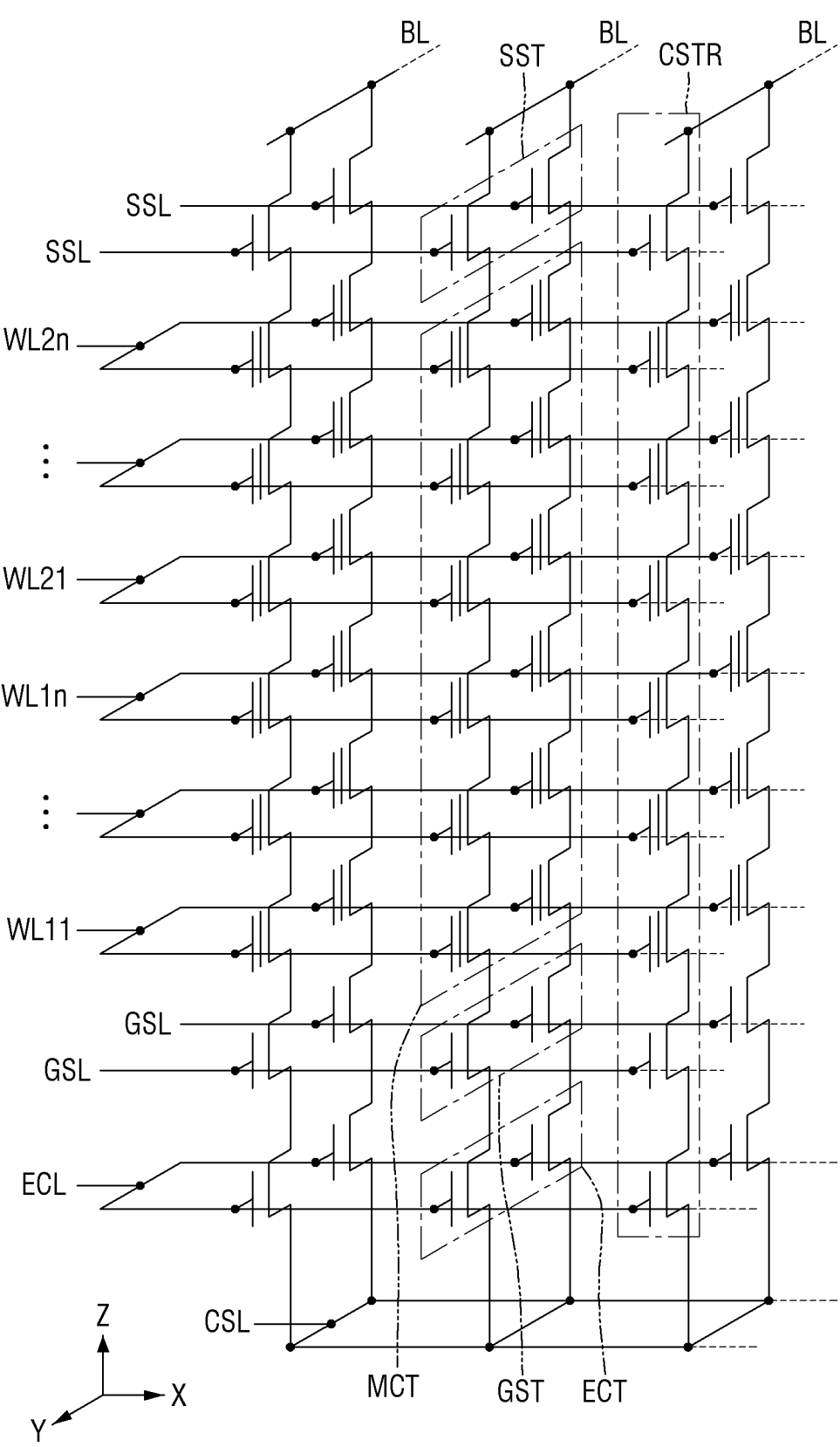
FIG. 2 is an exemplary circuit diagram of a semiconductor memory device according to some embodiments.

FIG. 2 is an exemplary circuit diagram of a semiconductor memory device according to some embodiments.

Referring to FIG. 2, the memory cell array (e.g., 20 of FIG. 1) of the semiconductor device according to some embodiments may include a common source line CSL, a plurality of bit lines BL, and a plurality of cell strings CSTR.

The common source line CSL may extend in a first direction X. In some embodiments, a plurality of common source lines CSL may be arranged two-dimensionally. For example, the plurality of common source lines CSL may be spaced apart from each other and each extend in the first direction X. The same voltage may be electrically applied to the common source lines CSL, or different voltages may be applied to the common source lines CSL and the common source lines CSL may be controlled separately.

The plurality of bit lines BL may be arranged two-dimensionally. For example, the bit lines BL may extend in a second direction Y that intersects the first direction X, and may be spaced apart from each other in the first direction X. A plurality of cell strings CSTR may be connected in parallel to each bit line BL. The cell strings CSTR may be commonly connected to the common source line CSL. That is, the plurality of cell strings CSTR may be placed between the bit lines BL and the common source line CSL.

Each cell string CSTR may include a ground selection transistor GST connected to the common source line CSL, a string selection transistor SST connected to the bit line BL, and a plurality of memory cell transistors MCT placed between the ground selection transistor GST and the string selection transistor SST. Each memory cell transistor MCT may include a data storage element. The ground selection transistor GST, the string selection transistor SST, and the memory cell transistors MCT may be connected in series.

The common source line CSL may be commonly connected to sources of the ground selection transistors GST. Also, the ground selection line GSL, a plurality of word lines WL11 to WL1$n$ and WL21 to WL2$n$, and the string selection line SSL may be placed between the common source line CSL and the bit line BL. The ground selection line GSL may be used as a gate electrode of the ground selection transistor GST, the word lines WL11 to WL1$n$ and WL21 to WL2$n$ may be used as gate electrodes of the memory cell transistors MCT, and the string selection line SSL may be used as the gate electrode of the string selection transistor SST.

In some embodiments, an erasure control transistor ECT may be placed between the common source line CSL and the ground selection transistor GST. The common source line CSL may be commonly connected to the sources of the erasure control transistors ECT. Further, an erasure control line ECL may be placed between the common source line CSL and the ground selection line GSL. The erasure control line ECL may be used as the gate electrode of the erasure control transistor ECT. The erasure control transistors ECT may generate a gate induced drain leakage (GIDL) to perform the erasure operation of the memory cell array.

Figure 3:
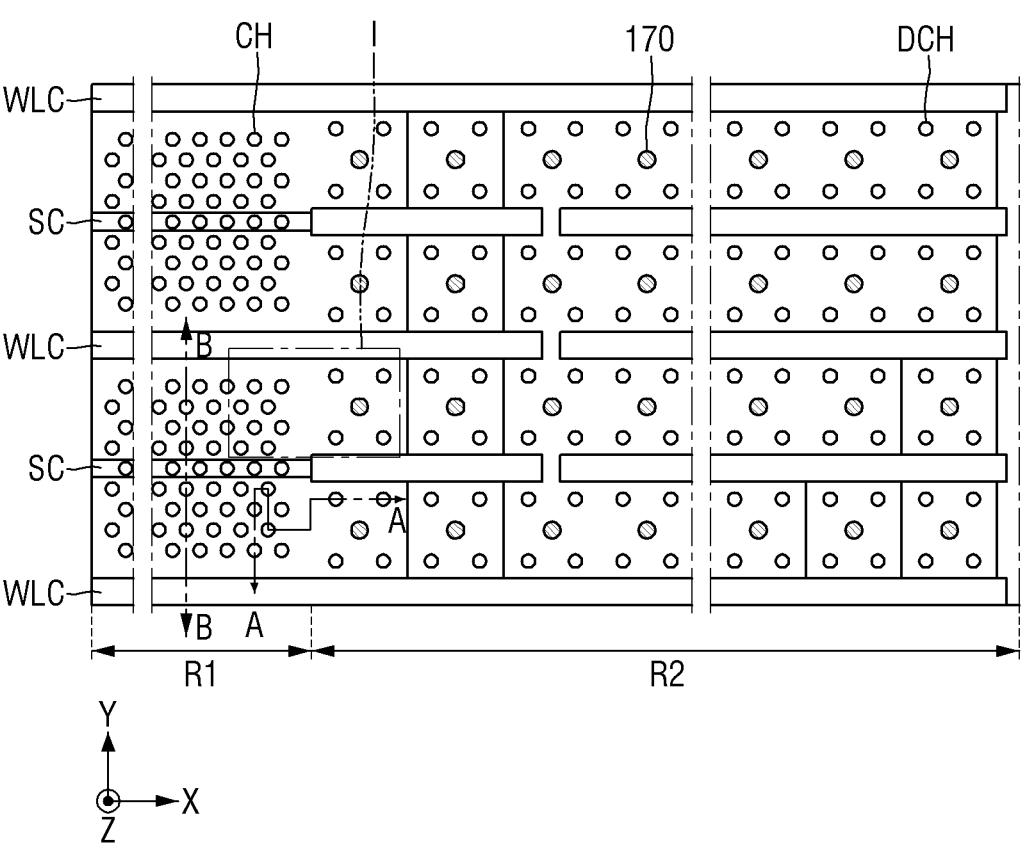
FIG. 3 is an exemplary layout diagram of a semiconductor memory device according to some embodiments.
Figure 4:
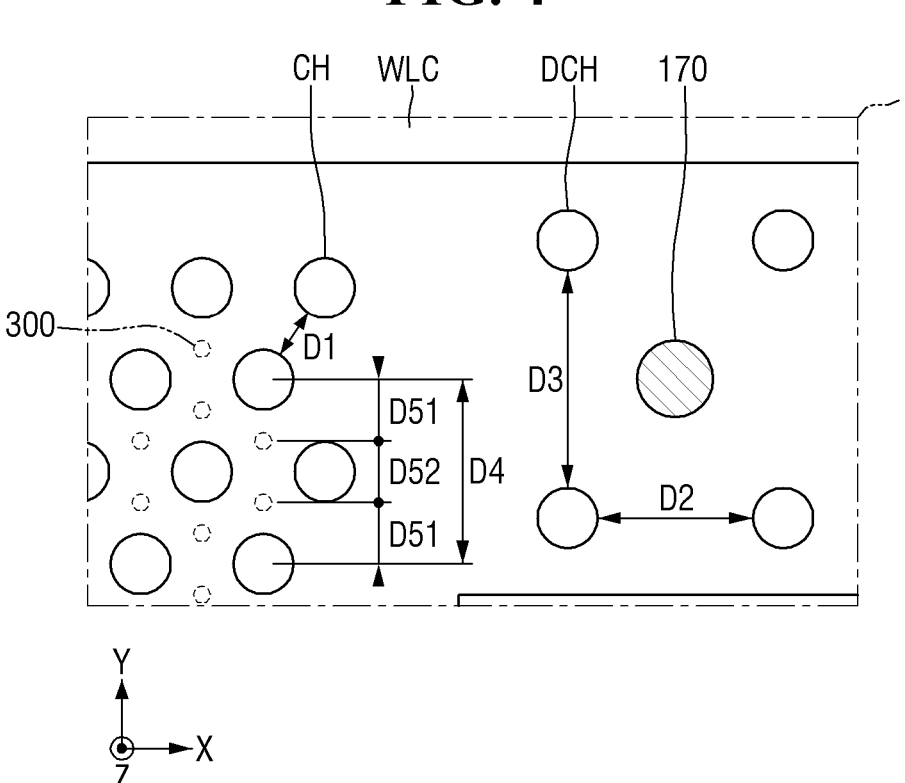
FIG. 4 is an enlarged view of region I of FIG. 3.
Figure 5:
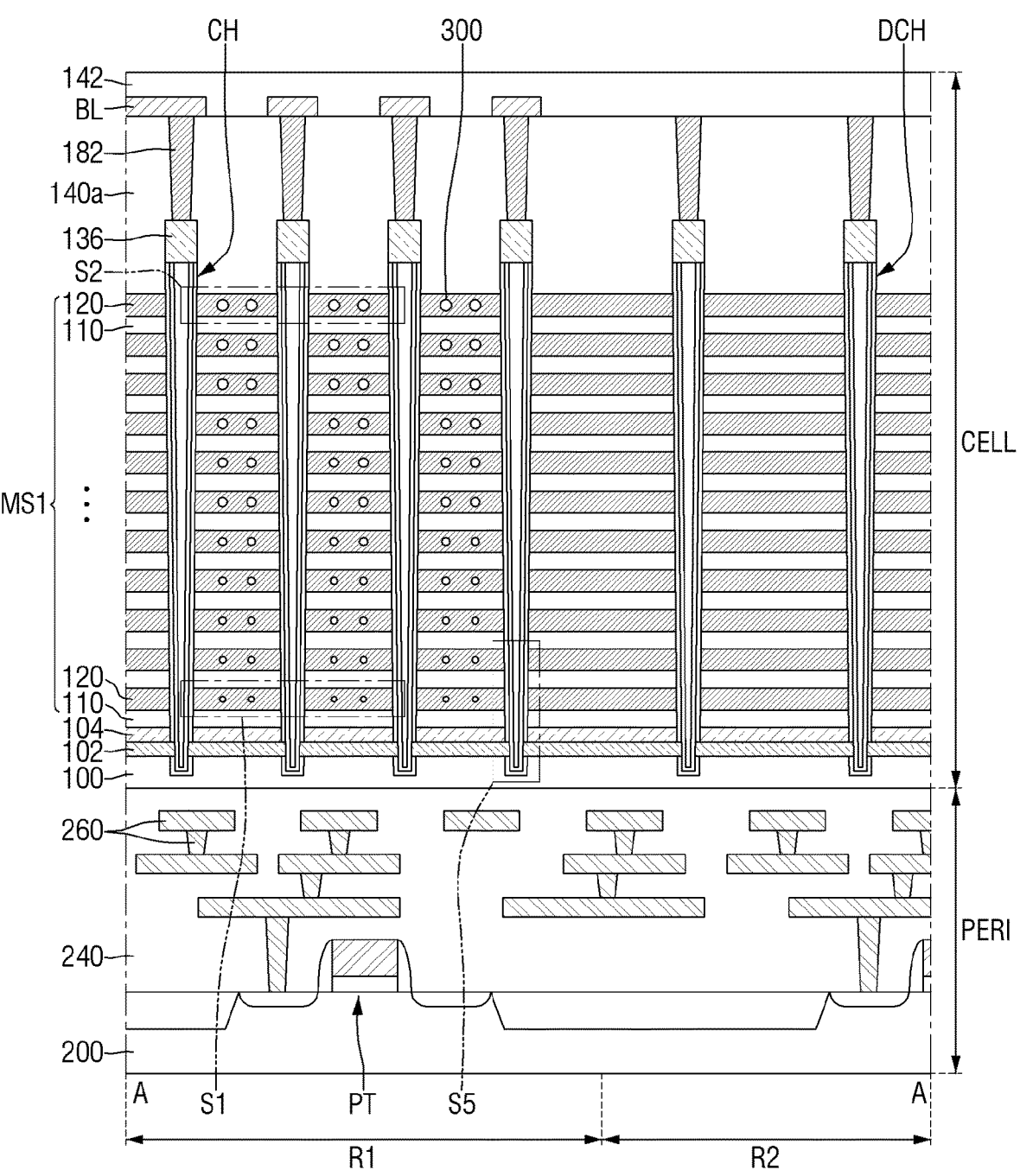
FIG. 5 is a cross-sectional view taken along line A-A of FIG. 3.
Figure 6:
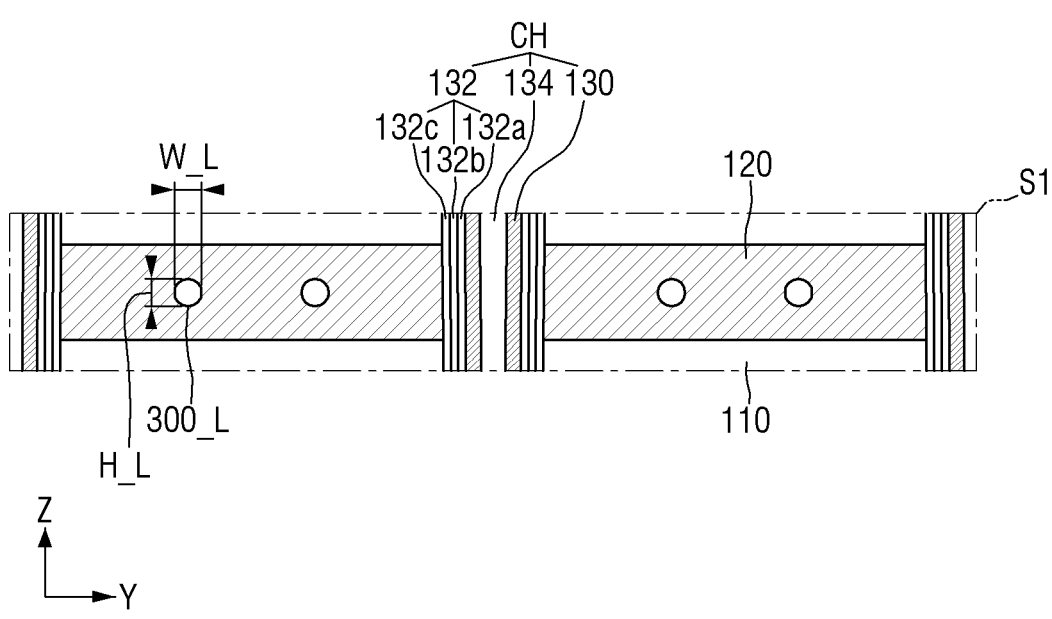
FIG. 6 is an enlarged view of region S1 of FIG. 5.
Figure 7:
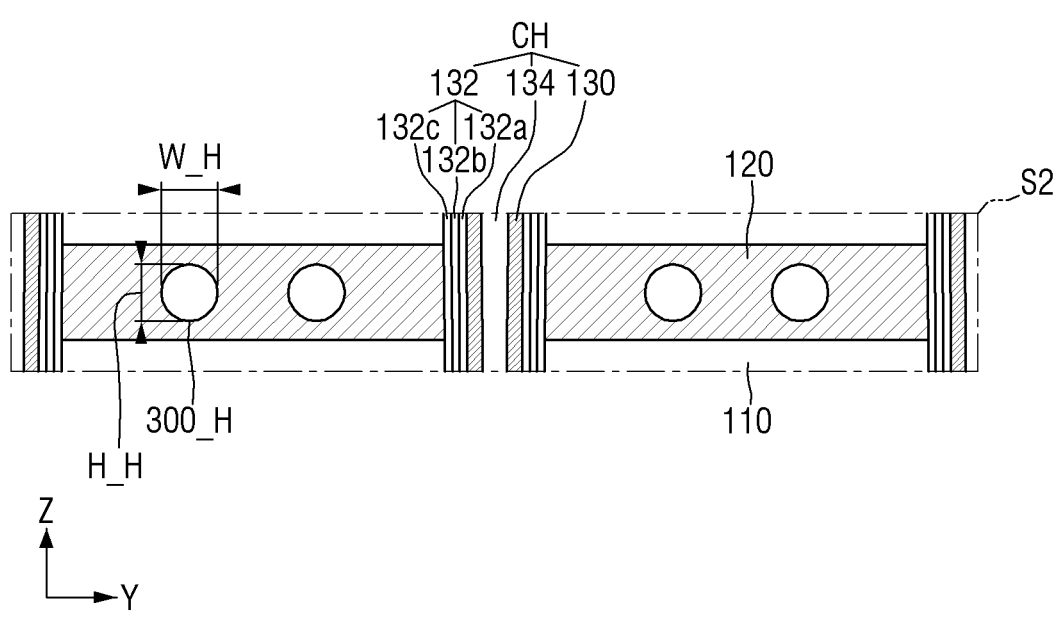
FIGS. 7 and 8 are enlarged views of region S2 of FIG. 5.
Figure 8:
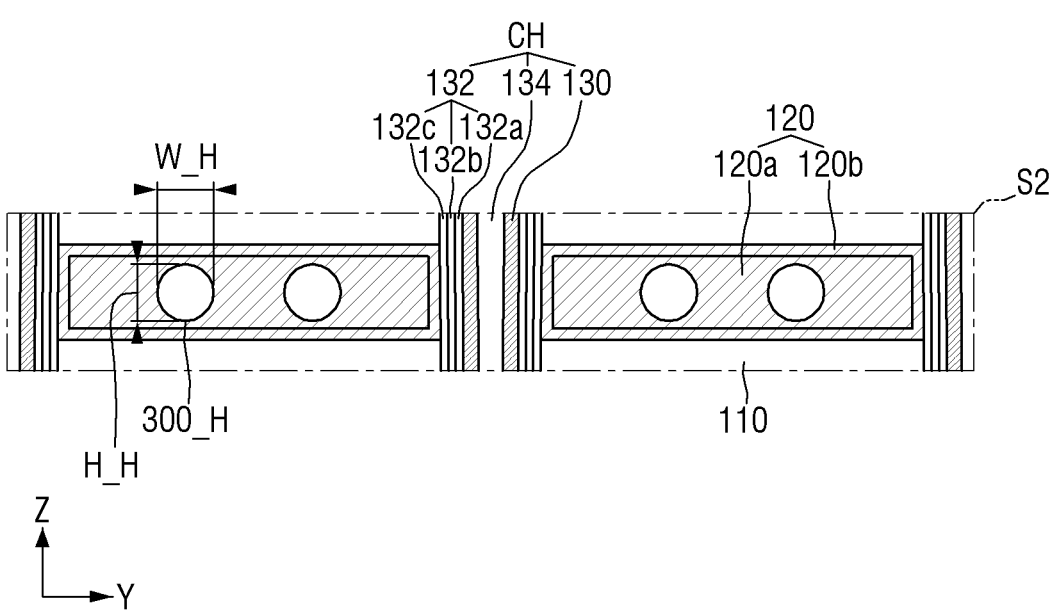
Figure 9:
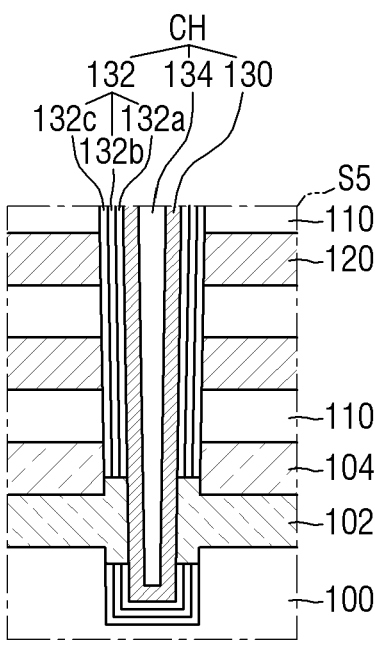
FIG. 9 is an enlarged view of region S5 of FIG. 5.
Figure 10:
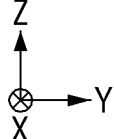
FIG. 10 is a cross-sectional view taken along line B-B of FIG. 3.
Figure 11:
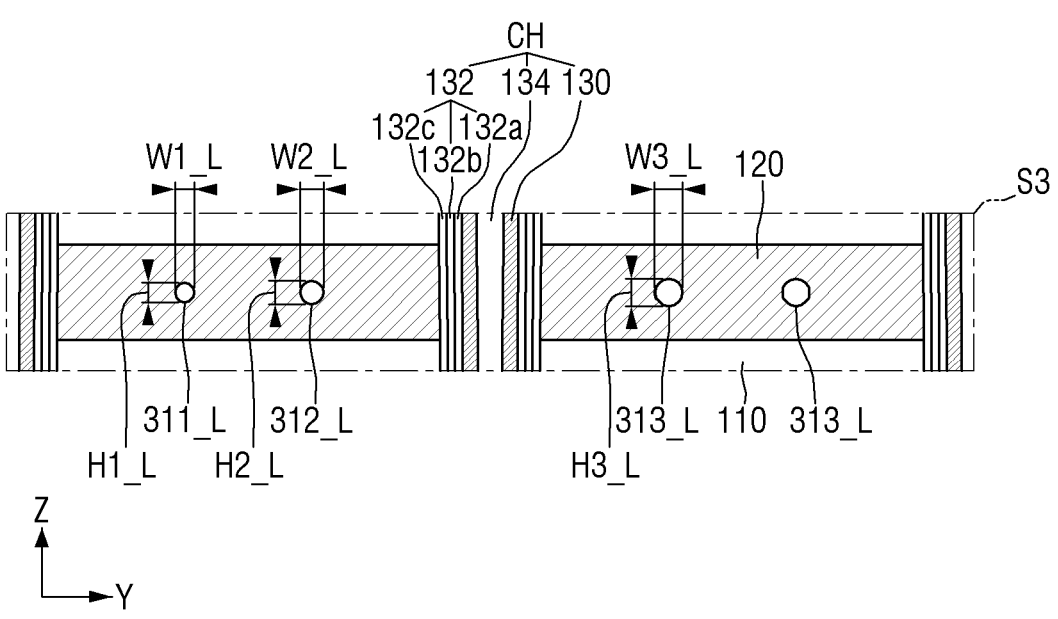
FIG. 11 is an enlarged view of region S3 of FIG. 10.
Figure 12:
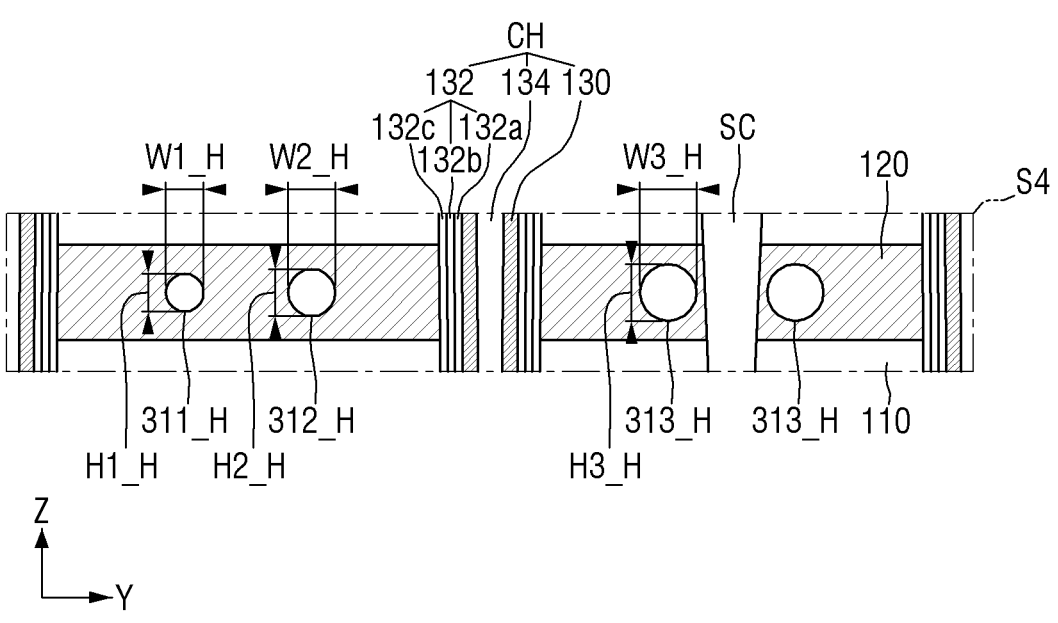
FIGS. 12 and 13 are enlarged views of region S4 of FIG. 10.
Figure 13:
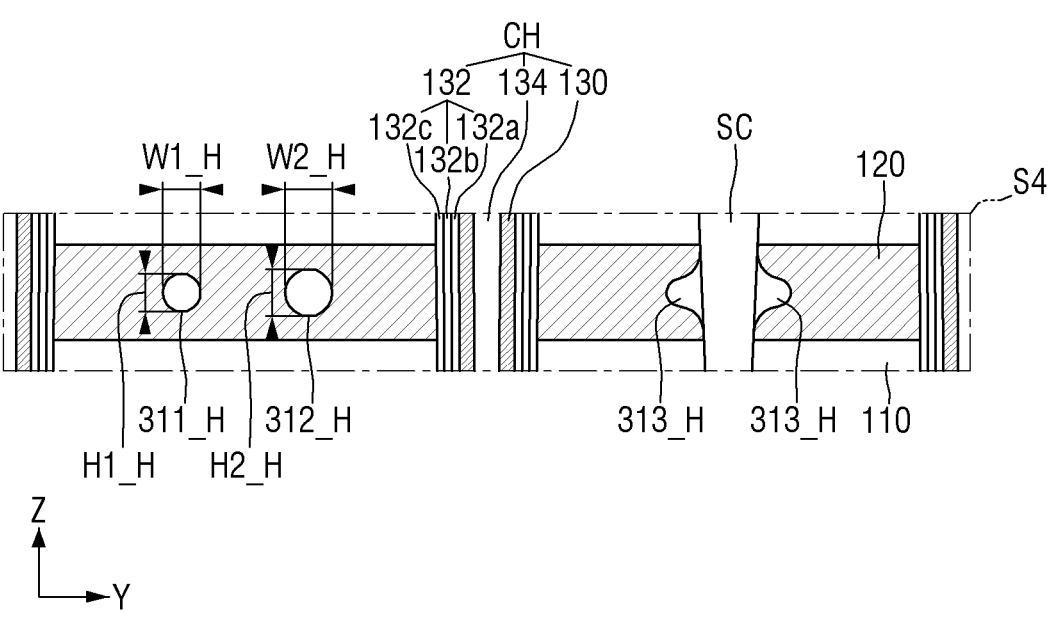

FIG. 3 is an exemplary layout diagram of a semiconductor memory device according to some embodiments. FIG. 4 is an enlarged view of region I of FIG. 3. FIG. 5 is a cross-sectional view taken along line A-A of FIG. 3. FIG. 6 is an enlarged view of region S1 of FIG. 5. FIGS. 7 and 8 are enlarged views of region S2 of FIG. 5. FIG. 9 is an enlarged view of region S5 of FIG. 5. FIG. 10 is a cross-sectional view taken along line B-B of FIG. 3. FIG. 11 is an enlarged view of region S3 of FIG. 10. FIGS. 12 and 13 are enlarged views of region S4 of FIG. 10.

Referring to FIGS. 3 to 7, a semiconductor memory device according to some embodiments may include a memory cell region CELL and a peripheral circuit region PERI. For example, as illustrate in FIG. 5, the memory cell region CELL may be stacked on top of the peripheral circuit region PERI.

The memory cell region CELL may include a cell substrate 100, a first mold structure MS1, a first interlayer insulating film 140$a$, a channel structure CH, a block separation structure WLC, a cell contact structure 170, a bit line BL, a bit line contact 182, and an upper inter-wiring insulating film 142. The peripheral circuit region PERI may include a peripheral circuit board 200, a transistor PT on the peripheral circuit board 200, a lower inter-wiring insulating film 240 covering the peripheral circuit board 200, and a wiring structure 260 within the lower inter-wiring insulating film 240.

For example, the cell substrate 100 may include a semiconductor substrate, e.g., a silicon substrate, a germanium substrate or a silicon-germanium substrate. In another example, the cell substrate 100 may include a silicon-on-insulator (SOI) substrate, a germanium-on-insulator (GOI) substrate, and the like. In some embodiments, the cell substrate 100 may include impurities. For example, the cell substrate 100 may include n-type impurities (e.g., phosphorus (P), arsenic (As), etc.). The cell substrate 100 may include a cell array region R1 and an extended region R2.

A memory cell array (e.g., 20 of FIG. 1) including a plurality of memory cells may be formed in the cell array region R1. For example, the channel structure CH, the bit line BL, first gate electrodes 120, and the like, which will be described later, may be placed in the cell array region R1. In the following description, a surface of the cell substrate 100 on which the memory cell array is placed may be referred to as a front side of the cell substrate 100. In contrast, a surface of the cell substrate 100 opposite to the front side of the cell substrate 100, i.e., a surface of the cell substrate 100 facing away from the channel structure CH and the first gate electrodes 120, may be referred to as a back side of the cell substrate 100.

The extended region R2 may be placed around the cell array region R1. Gate electrodes 120, which will be described later, may be stacked on the extended region R2 in a stepped manner.

The first mold structure MS1 may be formed on the front side (e.g., an upper side) of the cell substrate 100. The first mold structure MS1 may include a plurality of first gate electrodes 120 and a plurality of mold insulating films 110 that are alternately stacked on the cell substrate 100. Each first gate electrode 120 and each mold insulating film 110 may have a layered structure extending to be parallel to the upper side of the cell substrate 100. The first gate electrodes 120 are spaced apart from each other by the mold insulating film 110 and sequentially stacked on the cell substrate 100.

The first gate electrodes 120 may be stacked in a stepped manner in the extended region R2. For example, the first gate electrodes 120 may extend to different lengths in the first direction X and have a step. In some embodiments, the first gate electrodes 120 may have a step in the second direction Y. Therefore, each first gate electrode 120 may include a pad region exposed from the other first gate electrodes.

The cell contact structure 170 may be connected to the first gate electrode 120 in the extended region R2. The cell contact structure 170 may extend in a third direction Z and penetrate the first mold structure MS1. The cell contact structure 170 may be connected to the pad region of each first gate electrode 120.

The first gate electrodes 120 may correspond to the erasure control line ECL, the ground selection line GSL, the plurality of word lines WL11 to WL1n and WL21 to WL2n, and the string selection line SSL of FIG. 2. In some embodiments, the erasure control line ECL may be omitted. Further, in some embodiments, the first gate electrode adjacent to the ground selection line GSL or the first gate electrode adjacent to the string selection line SSL may be a dummy gate electrode.

For example, the mold insulating film 110 may include an insulating material, e.g., at least one of silicon oxide, silicon nitride and silicon oxynitride. As an example, the mold insulating film 110 may include silicon oxide.

The first interlayer insulating film 140a may be formed on the cell substrate 100. The first interlayer insulating film 140a may cover the first mold structure MS1. The first interlayer insulating film 140a may include, e.g., at least one of a silicon oxide, a silicon oxynitride, and a low dielectric constant (low-k) material having a smaller dielectric constant than the silicon oxide.

The channel structure CH may be formed inside the first mold structure MS1 of the cell array region R1. The channel structure CH may extend in a vertical direction, i.e., the third direction Z, intersecting the upper side of the cell substrate 100 and penetrate the first mold structure MS1. For example, the channel structure CH may have a pillar shape (e.g., a columnar shape) extending in the third direction Z. In some embodiments, a width of the channel structure CH may increase as it goes away from the cell substrate 100. The channel structure CH may include a semiconductor pattern 130 and an information storage film 132.

The semiconductor pattern 130 may extend in the third direction Z and penetrate the first mold structure MS1. For example, as illustrated in FIGS. 5 and 9, the semiconductor pattern 130 may have a cup shape. In another example, semiconductor pattern 130 may have various shapes, e.g., a cylindrical shape, a rectangular barrel shape, and a solid filler shape. For example, the semiconductor pattern 130 may include a semiconductor material, e.g., at least one of single crystal silicon, polycrystalline silicon, organic semiconductor substance, and carbon nanostructure.

The information storage film 132 may be interposed between the semiconductor pattern 130 and each first gate electrode 120. For example, the information storage film 132 may extend along the outer side surface of the semiconductor pattern 130. The information storage film 132 may include, e.g., at least one of silicon oxide, silicon nitride, silicon oxynitride, and high dielectric constant materials having a higher dielectric constant than silicon oxide. The high dielectric constant material may include, e.g., at least one of aluminum oxide, hafnium oxide, lanthanum oxide, tantalum oxide, titanium oxide, lanthanum hafnium oxide, lanthanum aluminum oxide, dysprosium scandium oxide, and combinations thereof.

In some embodiments, a plurality of channel structures CH may be arranged in a form of a zigzag. For example, as shown in FIG. 3, a plurality of channel structures CH may be arranged alternately in the first direction X and the second direction Y. The plurality of channel structures CH arranged in the form of a zigzag may further improve the degree of integration of the semiconductor memory device. In some embodiments, the plurality of channel structures CH may be arranged in the form of a honeycomb.

In some embodiments, a dummy channel structure DCH may be formed inside the first mold structure MS1 of the extended region R2. The dummy channel structure DCH may be formed in a shape similar to the channel structure CH to reduce the stress applied to the first mold structure MS1 in the extended region R2.

In some embodiments, the information storage film 132 may be formed of multiple films. For example, referring to FIG. 9, the information storage film 132 may include a tunnel insulating film 132a, a charge storage film 132b, and a blocking insulating film 132c which are sequentially stacked on the outer side surface of the semiconductor pattern 130.

The tunnel insulating film 132a may include, e.g., silicon oxide or a high dielectric constant material having a higher dielectric constant than silicon oxide (e.g., aluminum oxide ($Al_2O_3$) and/or hafnium oxide ($HfO_2$)). The charge storage film 132b may include, e.g., silicon nitride. The blocking insulating film 132c may include, e.g., silicon oxide or a high dielectric constant material having a higher dielectric constant than silicon oxide (e.g., aluminum oxide ($Al_2O_3$) and/or hafnium oxide ($HfO_2$)).

In some embodiments, the channel structure CH may further include a filling pattern 134. The filling pattern 134 may be formed to fill the inside of the cup-shaped semiconductor pattern 130. For example, the filling pattern 134 may include an insulating material, e.g., silicon oxide.

In some embodiments, as illustrated in FIG. 5, the channel structure CH may further include a channel pad 136. The channel pad 136 may be formed to be connected to the semiconductor pattern 130. For example, the channel pad 136 may be formed inside the first interlayer insulating film 140a and connected to the upper part of the semiconductor pattern 130. The channel pad 136 may include, e.g., impurity-doped polysilicon.

Referring to FIGS. 5 and 9, in some embodiments, first source structures 102 and 104 may be formed on the cell substrate 100. The first source structures 102 and 104 may be interposed between the cell substrate 100 and the first mold structure MS1. For example, the first source structures 102 and 104 may extend along the upper side of the cell substrate 100. The first source structures 102 and 104 may be formed to be connected to the semiconductor pattern 130 of the channel structure CH. For example, as shown in FIG. 9, the first source structures 102 and 104 may penetrate the information storage film 132 and come into contact with the semiconductor pattern 130. Such first source structures 102 and 104 may be provided as a common source line (e.g., CSL of FIG. 2) of the semiconductor memory device. The first source structures 102 and 104 may include, e.g., impurities-doped polysilicon or metal.

In some embodiments, the channel structure CH may penetrate the first source structures 102 and 104. For example, the lower part of the channel structure CH may penetrate the first source structures 102 and 104 and be embedded in the cell substrate 100.

In some embodiments, the first source structures 102 and 104 may be formed of multiple films. For example, the first source structures 102 and 104 may include a first source layer 102 and a second source layer 104 that are sequentially stacked on the cell substrate 100. The first source layer 102 and the second source layer 104 may each include, e.g., impurity-doped polysilicon or impurity-undoped polysilicon. The first source layer 102 comes into contact with the semiconductor pattern 130 and may be provided as a common source line (e.g., CSL of FIG. 2) of the semiconductor memory device. The second source layer 104 may be used as a support layer for preventing the mold stack from collapsing or falling in an alternative process for forming the first source layer 102.

A base insulating film may be interposed between the cell substrate 100 and the first source structures 102 and 104. The base insulating film may include, e.g., at least one of silicon oxide, silicon nitride and silicon oxynitride.

The block separation structure WLC may extend in the first direction X and cut the first mold structure MS1. The first mold structure MS1 may be cut by a plurality of block separation structures WLC to form a plurality of memory cell blocks (e.g., BLK1 to BLKn of FIG. 1). For example, referring to FIGS. 3 and 10, two adjacent block separation structures WLC may define one memory cell block between them. A plurality of channel structures CH may be placed inside each memory cell block defined by the block separation structures WLC. A number of the channel structures CH arranged inside a memory cell block along the second direction Y in a zigzag manner may be adjusted to any suitable number.

In some embodiments, the block separation structure WLC may extend in the first direction X and cut the first source structures 102 and 104, e.g., the block separation structure WLC may extend vertically in the third direction Z through all the gate electrodes 120 to cut the first source structures 102 and 104 (FIG. 10). For example, the lower side of the block separation structure WLC may be lower than the lower sides of the first source structures 102 and 104, e.g., a distance from the bottom of the block separation structure WLC to the back side of the cell substrate 100 may be smaller than a distance from the bottom of the first source structures 102 and 104 to the back side of the cell substrate 100. In another example, as illustrated in FIG. 10, the lower side of the block separation structure WLC may be placed on the same plane as the lower side of the first source layer 102.

In some embodiments, the block separation structure WLC may include an insulating material. For example, the insulating material may fill the block separation structure WLC. The insulating material may include, e.g., at least one of silicon oxide, silicon nitride and silicon oxynitride.

In some embodiments, a string separation structure SC may be formed inside the first mold structure MS1. The string separation structure SC, e.g., a string separation pattern, may extend in the first direction X and cut the first gate electrode 120. The string separation structure SC may cut, e.g., only, a part of the first gate electrodes 120 placed at the uppermost part, e.g., the string separation structure SC may cut only two of the uppermost first gate electrodes 120 (FIG. 10). Each memory cell block defined by the block separation structures WLC may be divided by the string separation structure SC to form a plurality of string regions. For example, referring to FIG. 10, the string separation structure SC may define two string regions inside one memory cell block (between block separation structures WLC).

The bit line BL may be formed on the first mold structure MS1 and the first interlayer insulating film 140a. The bit line BL may extend in the second direction Y and intersect the block separation structure WLC. Further, the bit line BL may extend in the second direction Y, and may be connected to a plurality of channel structures CH arranged along the second direction Y. For example, the bit line contact 182 connected to the upper part of each channel structure CH may be formed inside the first interlayer insulating film 140a. The bit line BL may be electrically connected to the channel structures CH through the bit line contact 182.

Referring to FIG. 4, three adjacent channel structures CH may be placed at vertices of a triangle. The channel structure CH may be arranged at a first interval D1 in a direction between the first direction X and the second direction Y, e.g., the first interval D1 may be measured in a diagonal direction between the first and second directions X and Y.

Four adjacent dummy channel structures DCH may be placed at vertices of a quadrangle, e.g., a square or a rectangle. For example, the dummy channel structures DCH may be arranged at a second interval D2 in the first direction X, and may be arranged at a third interval D3 in the second direction Y. For example, the second interval D2 may be equal to the third interval D3. The first interval D1 may be smaller than each of the second interval D2 and the third interval D3.

Since the intervals D2 and D3 between the dummy channel structures DCH are greater than the interval D1 between the channel structures CH, a slit may not be formed inside the first gate electrode 120 between the dummy channel structures DCH in the process of forming the first gate electrode 120, while a slit may be formed inside the first gate electrode 120 between the channel structures CH. Therefore, in some embodiments, at least one of the plurality of first gate electrodes 120 may include a void 300 that is an empty space inside. As illustrated in FIGS. 4 and 5, the first gate electrode 120 between the channel structures CH adjacent to each other may include at least one void 300. On the other hand, the first gate electrode 120 between the dummy channel structures DCH may not include the void 300.

The number of voids 300 included in each of the first gate electrodes 120 may be adjusted to any suitable number, e.g., one or three or more. The void 300 may be formed inside the first gate electrode 120 by an annealing process. In some embodiments, the first gate electrode 120 may include molybdenum (Mo). By the annealing process, grains of the first gate electrode 120 may be joined, and at this time, the void 300 may be formed between the grains.

The first gate electrode 120 between the channel structures CH adjacent to each other in the second direction Y may include, e.g., two voids 300 (FIGS. 4 and 10). In some embodiments, the center of the void 300 may be located at a center of a triangle consisting of the centers of three channel structures CH adjacent to each other. A distance D51 from the center of the void 300 to the center of the three adjacent channel structures CH may be substantially the same. In some embodiments, a distance D52 between the centers of two adjacent voids 300 may be substantially the same as the distance D51 from the center of the voids 300 to the center of the adjacent channel structures CH.

In some embodiments, the void 300 may have a spherical shape. The cross section of the void 300 may have a circular shape. In some embodiments, the void 300 may have a polyhedral structure.

In some embodiments, the first gate electrode 120 between the channel structures CH separated from the block separation structure WLC by substantially the same distance may include voids 300 of substantially the same size. For example, the width in the first direction X and/or the width in the second direction Y of the void 300 included in the first gate electrode 120 between the channel structures CH separated from the block separation structure WLC by substantially the same distance may be substantially the same. For example, in a cross section including the first direction X and the third direction Z, or a cross section including the second direction Y and the third direction Z, the cross-sectional areas of the voids 300 included in the first gate electrode 120 between the channel structures CH separated from the block separation structure WLC by substantially the same distance may be substantially the same. For example, as illustrated in FIG. 10, the cross-sectional areas of the voids 300 included in the first gate electrode 120 between the channel structures CH separated from the block separation structure WLC by substantially the same distance (in the second direction Y) may be substantially the same.

In some embodiments, the sizes of the voids 300 included in each first gate electrode 120 may be different from each other. The size of the void 300 included in the first gate electrode 120 may increase as it goes away from the cell substrate 100. For example, the width in the first direction X and/or the width in the second direction Y of the voids 300 included in each first gate electrode 120 may increase as it goes away from the cell substrate 100. For example, in the cross section including the first direction X and the third direction Z, or the cross section including the second direction Y and the third direction Z, the cross-sectional areas of the voids 300 included in each first gate electrode 120 may increase as they go away from the cell substrate 100. For example, as illustrated in FIGS. 5 and 10, the width in each of the first direction X and the second direction Y of the voids 300 increases as a distance in the third Z direction from the cell substrate 100 increases.

In detail, referring to FIGS. 6 and 7, a size of a void $300\_H$ (FIG. 7) included in the first gate electrode 120 placed at the uppermost part of the first mold structure MS1 may be greater than a size of a void $300\_L$ (FIG. 6) included in the first gate electrode 120 placed at the lowermost part of the first mold structure MS1. For example, a maximum width $W\_H$ of the void $300\_H$ in the second direction Y may be greater than a maximum width $W\_L$ of the void $300\_L$ in the second direction Y. For example, a maximum width $H\_H$ of the void $300\_H$ in the third direction Z may be greater than a maximum width $H\_L$ of the void $300\_L$ in the third direction Z.

For example, referring to FIG. 8, the first gate electrode 120 may include a filling layer 120a and a barrier layer 120b. The barrier layer 120b may wrap the filling layer 120a. The filling layer 120a may fill the trench defined by the barrier layer 120b. A boundary between the barrier layer 120b and the filling layer 120a may be uncertain. The filling layer 120a may include, e.g., molybdenum (Mo). The barrier layer 120b may include, e.g., at least one of titanium nitride (TiN), tungsten (W), tungsten nitride (WN), molybdenum nitride (MoN), molybdenum (Mo), and molybdenum compound (Mo compound).

Referring to FIG. 10, in some embodiments, the size, e.g., diameter, of the void 300 included in the first gate electrode 120 may vary depending on the distance spaced apart from the block separation structure WLC. For example, referring to FIG. 10, the size of adjacent voids 300 included in a same first gate electrode 120 may be different from each other, in accordance with a distance from the block separation structure WLC along the second direction Y.

Referring to FIG. 11, the sizes of voids $311\_L$, $312\_L$, and $313\_L$ included in the first gate electrode 120 may increase as they go away from the block separation structure WLC. For example, a maximum width $W3\_L$ of the void $313\_L$ in the second direction Y may be greater than a maximum width $W2\_L$ of the void $312\_L$ in the second direction Y, and the maximum width $W2\_L$ of the void $312\_L$ in the second direction Y may be greater than a maximum width $W1\_L$ of the void $311\_L$ in the second direction Y. For example, a maximum width $H3\_L$ of the void $313\_L$ in the third direction Z may be greater than a maximum width $H2\_L$ of the void $312\_L$ in the third direction Z, and the maximum width $H2\_L$ of the void $312\_L$ in the third direction Z may be greater than a maximum width $H1\_L$ of the void $311\_L$ in the third direction Z. For example, an area of the void $313\_L$ may be greater than an area of the void $312\_L$, and the area of the void $312\_L$ may be greater than an area of the void $311\_L$.

For example, referring to FIG. 12, a maximum width $W3\_H$ of a void $313\_H$ in the second direction Y may be greater than a maximum width $W2\_H$ of a void $312\_H$ in the second direction Y, and the maximum width $W2\_H$ of the void $312\_H$ in the second direction Y may be greater than a maximum width $W1\_H$ of a void $311\_H$ in the second direction Y. For example, a maximum width $H3\_H$ of the void $313\_H$ in the third direction Z may be greater than a maximum width $H2\_H$ of the void $312\_H$ in the third direction Z, and the maximum width H2_H of the void 312_H in the third direction Z may be greater than a maximum width H1_H of the void 311_H in the third direction Z. For example, the area of the void 313_H may be greater than the area of the void 312_H, and the area of the void 312_H may be greater than the area of the void 311_H.

Referring to FIGS. 11 and 12, the sizes of each of the voids 311_H, 312_H, and 313_H may be greater than the sizes of each of the voids 311_L, 312_L, and 313_L. For example, referring to FIG. 12, the string separation structure SC may be placed between the voids 313_H, e.g., the string separation structure SC may be spaced apart from the void 313_H.

Referring to FIG. 13, in some embodiments, the string separation structure SC may penetrate the void 313_H. For example, the void 313_H may be placed on at least one side wall of the string separation structure SC.

Figure 14:
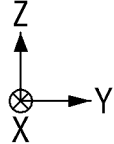
FIG. 14 is a cross-sectional view of a semiconductor memory device according to some embodiments.

FIG. 14 is a cross-sectional view of a semiconductor memory device according to some embodiments. For reference, FIG. 14 is a cross-sectional view taken along line B-B of FIG. 3, and FIG. 11 is an enlarged view of region S3 of FIG. 14. For convenience of explanation, repeated parts of contents explained above with reference to FIGS. 1 to 13 will be only briefly described or omitted.

Referring to FIG. 14, in some embodiments, the first gate electrode 120 between channel structures CH adjacent to each other includes the void 300, but the first gate electrode 120 between the string separation structure SC and the adjacent channel structures CH may not include the void 300. That is, as illustrated in FIG. 14, a portion of the first gate electrode 120 between the string separation structure SC and each of the immediately adjacent channel structures CH may not include any void 300.

Figure 15:
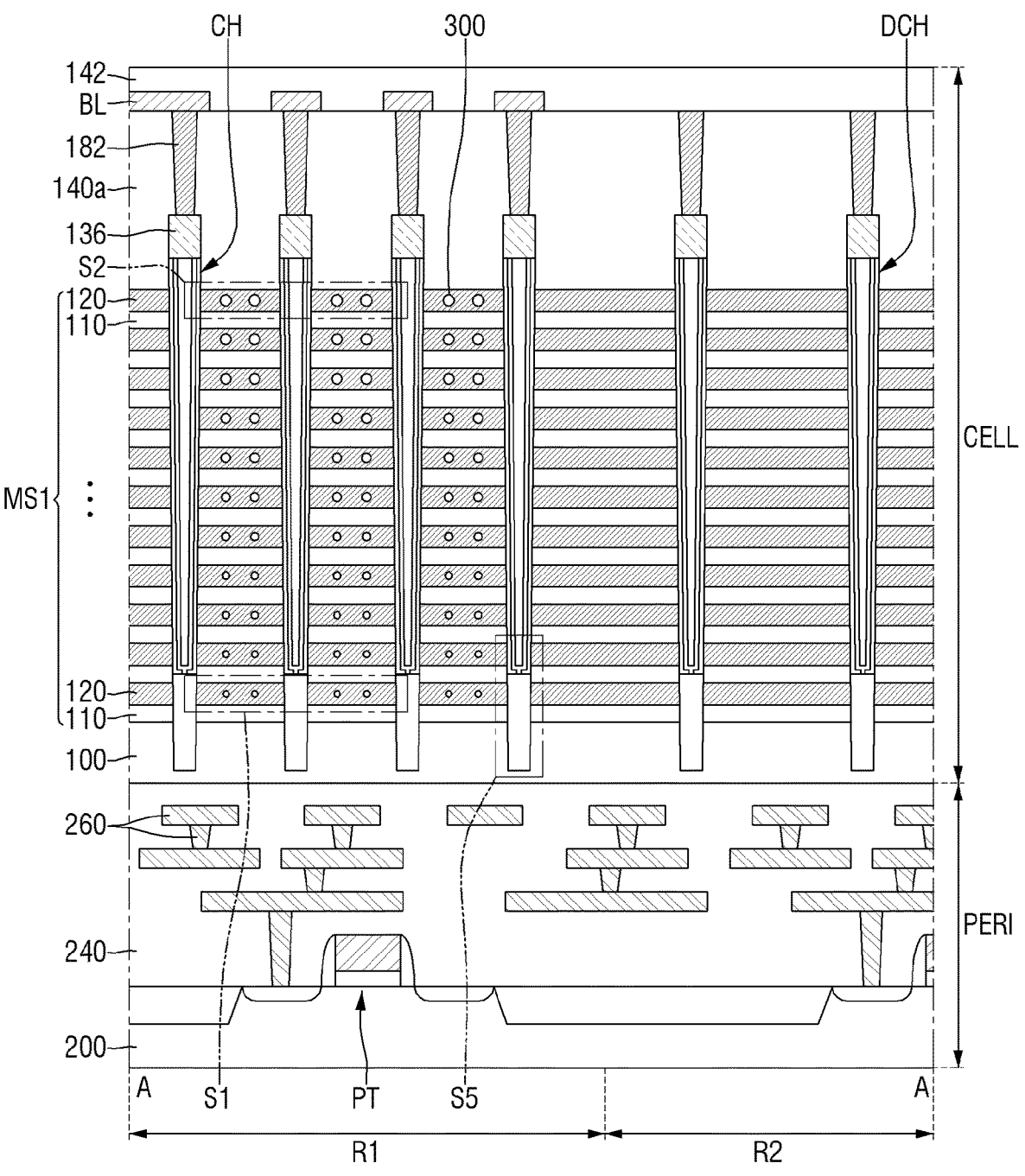
FIG. 15 is a cross-sectional view of a semiconductor memory device according to some embodiments.
Figure 16:
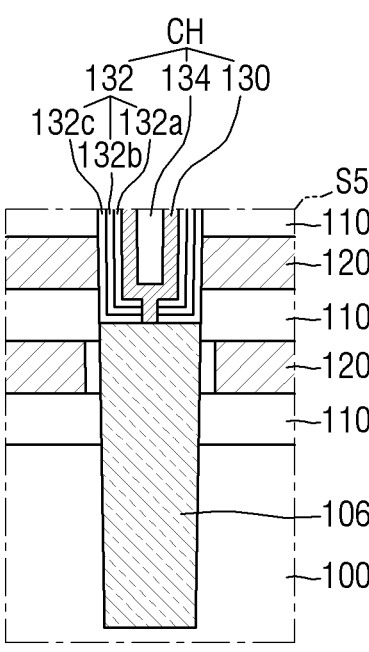
FIG. 16 is an enlarged view of region S5 of FIG. 15.

FIG. 15 is a cross-sectional view of a semiconductor memory device according to some embodiments. FIG. 16 is an enlarged view of region S5 of FIG. 15. For reference, FIG. 15 is a cross-sectional view taken along line A-A of FIG. 3. The enlarged view of region S1 of FIG. 15 is FIG. 6, and the enlarged view of the region S2 of FIG. 15 is FIG. 7. For convenience of explanation, repeated parts of contents explained above with reference to FIGS. 1 to 13 will be only briefly described or omitted.

Referring to FIGS. 15 and 16, a semiconductor memory device according to some embodiments may include a second source structure 106. The second source structure 106 may be formed on the cell substrate 100.

For example, as illustrate in FIG. 16, the lower part of the second source structure 106 may be embedded in the cell substrate 100. The second source structure 106 may be connected to the semiconductor pattern 130 of the channel structure CH. For example, the semiconductor pattern 130 may penetrate the information storage film 132 and may come into contact with the upper side of the second source structure 106. For example, the second source structure 106 may be formed from the cell substrate 100 by a selective epitaxial growth process.

In some embodiments, the upper side of the second source structure 106 may intersect a part of the first gate electrode 120. As an example, the upper side of the second source structure 106 may be formed to be higher than the upper side of the first gate electrode 120 placed at the lowermost part. In such a case, a gate insulating film may be interposed between the second source structure 106 and the first gate electrode 120 that intersects the second source structure 106.

Figure 17:
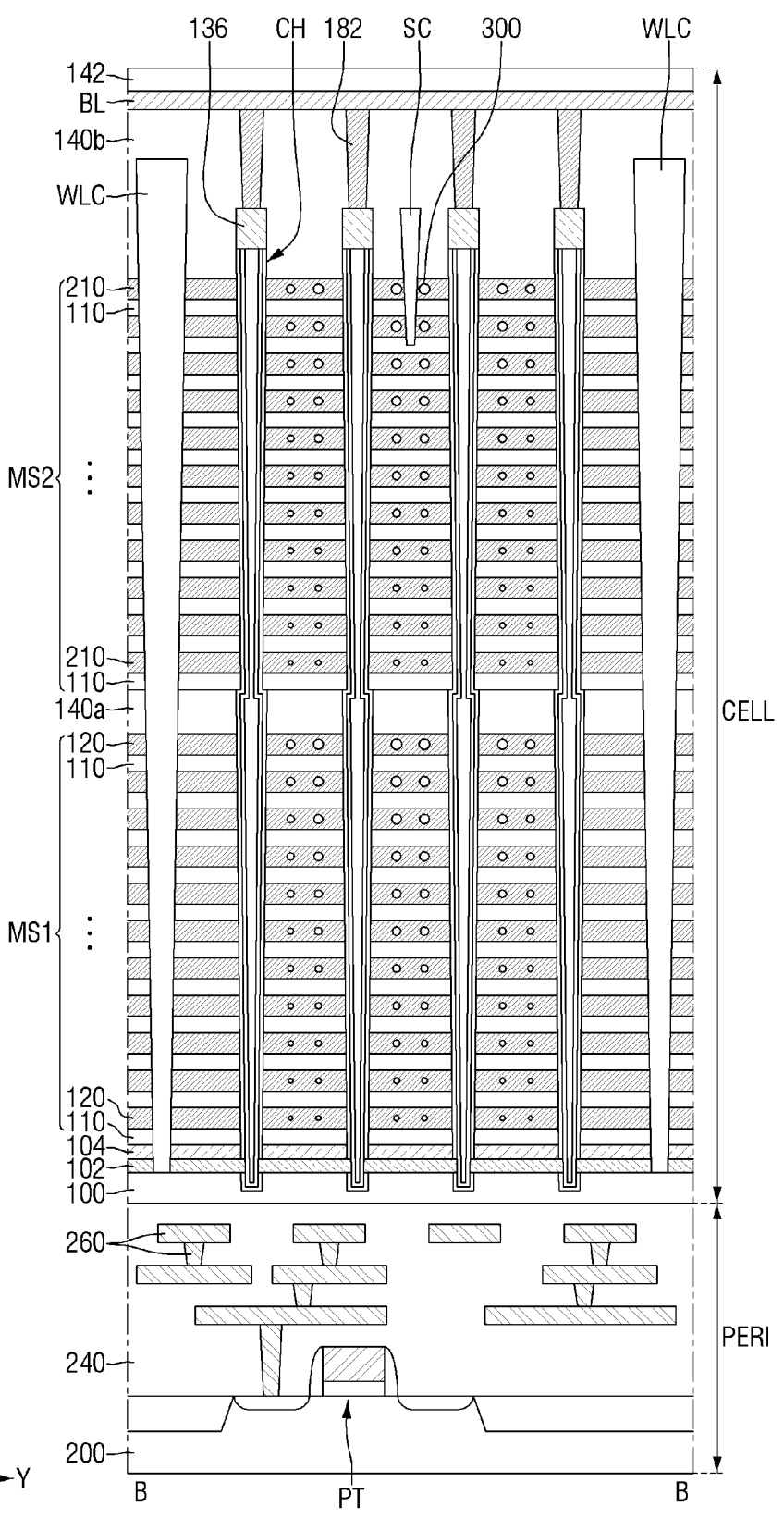
FIG. 17 is a cross-sectional view of a semiconductor memory device according to some embodiments.

FIG. 17 is a cross-sectional view of a semiconductor memory device according to some embodiments. For reference, FIG. 17 is a cross-sectional view taken along line B-B of FIG. 3. For convenience of explanation, repeated parts of contents explained above with reference to FIGS. 1 to 13 will be only briefly described or omitted.

Referring to FIG. 17, a semiconductor memory device according to some embodiments may further include a second mold structure MS2. The second mold structure MS2 may be formed on the first mold structure MS1.

In detail, the second mold structure MS2 may be formed on the first interlayer insulating film 140a. The second mold structure MS2 may include a plurality of second gate electrodes 220 and a plurality of mold insulating films 110 that are alternately stacked on the cell substrate 100. Each second gate electrode 220 and each mold insulating film 110 may have a layered structure extending to be parallel to the upper side of the cell substrate 100. The second gate electrodes 220 are spaced apart each other by the mold insulating films 110 and may be sequentially stacked on the cell substrate 100.

Each of the first gate electrodes 120 may correspond to one of the erasure control line ECL, the ground selection line GSL, and the plurality of word lines WL11 to WL1n of FIG. 2, and each of the second gate electrode 220 may correspond to one of the plurality of word lines WL21 to WL2n and the string selection line SSL of FIG. 2. In some embodiments, the second gate electrode adjacent to the string selection line SSL may be a dummy gate electrode.

A second interlayer insulating film 140b may be formed on the cell substrate 100. The second interlayer insulating film 140b may cover the second mold structure MS2. The second interlayer insulating film 140b may include, e.g., at least one of silicon oxide, silicon oxynitride, and a low dielectric constant (low-k) material having a smaller dielectric constant than silicon oxide.

The channel structure CH may, e.g., continuously, penetrate the first and second mold structures MS1 and MS2. In some embodiments, the width of the channel structure CH inside each of the first and second mold structures MS1 and MS2 may increase as it goes away from the cell substrate 100. In some embodiments, the channel structure CH may have a bent part between the first mold structure MS1 and the second mold structure MS2. This may be due to, e.g., characteristics of the etching process for forming the channel structure CH.

In some embodiments, at least one of the plurality of first and second gate electrodes 120 and 220 may include a void 300 that is an empty space inside. The first and second gate electrodes 120 and 220 between the channel structures CH adjacent to each other may include at least one void 300. The number of voids 300 included in each of the first and second gate electrodes 120 and 220 is not limited thereto, e.g., may be one or three or more. Further, the number of voids 300 included in the first gate electrode 120 may be different from the number of voids 300 included in the second gate electrode 220. In some embodiments, each of the first and second gate electrodes 120 and 220 may include molybdenum (Mo).

In some embodiments, the sizes of the voids 300 included in each first gate electrode 120 may differ from the sizes of the voids 300 included in each second gate electrode 220. For example, the sizes of the voids 300 included in each first gate electrode 120 and the sizes of the voids 300 included in each second gate electrode 220 may increase as they go away, e.g., as a distance increases, from the cell substrate 100. For example, the sizes of the voids 300 included in the first gate electrode 120 and the sizes of the voids 300 included in the second gate electrode 220 may increase as they go away, e.g., as a distance increases, from the block separation structure WLC.

Figure 18:
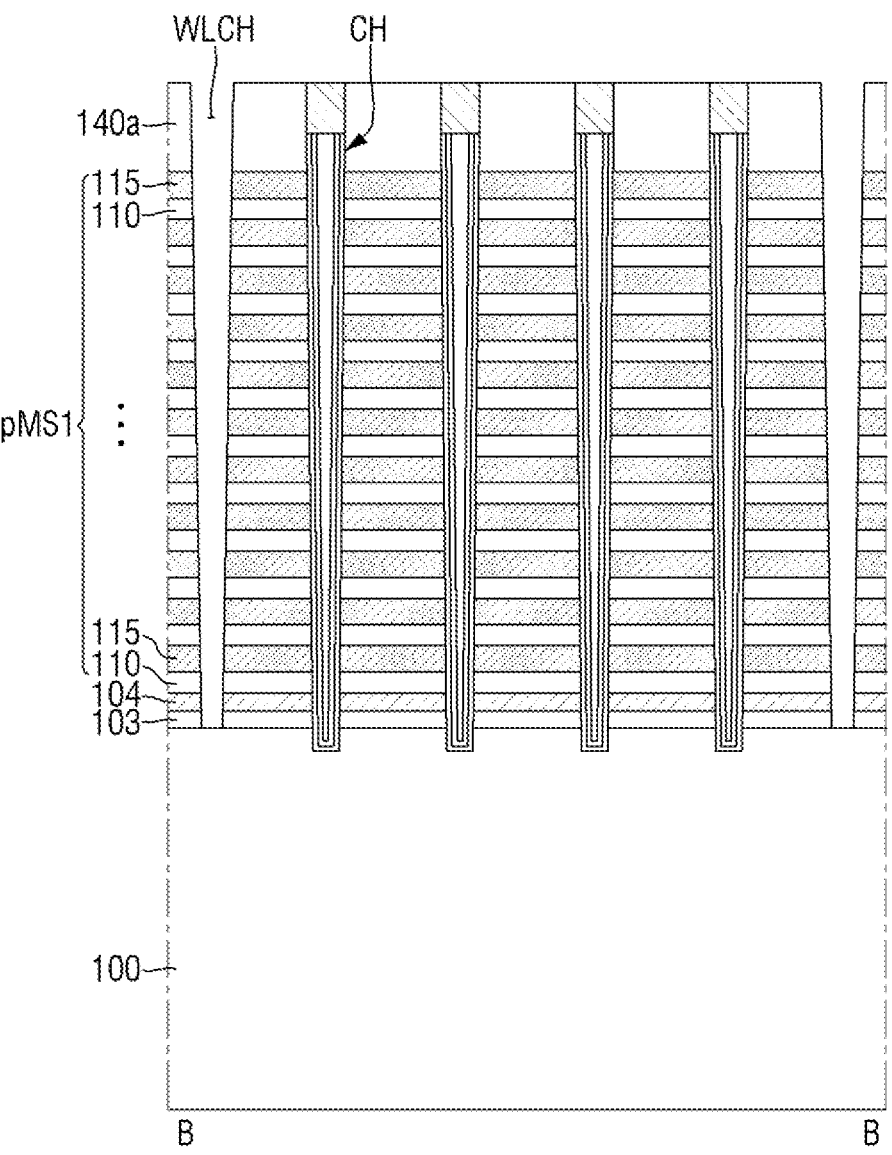
FIGS. 18 to 19 are intermediate stages in a method for manufacturing a semiconductor memory device according to some embodiments.
Figure 18:
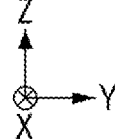
Figure 19:
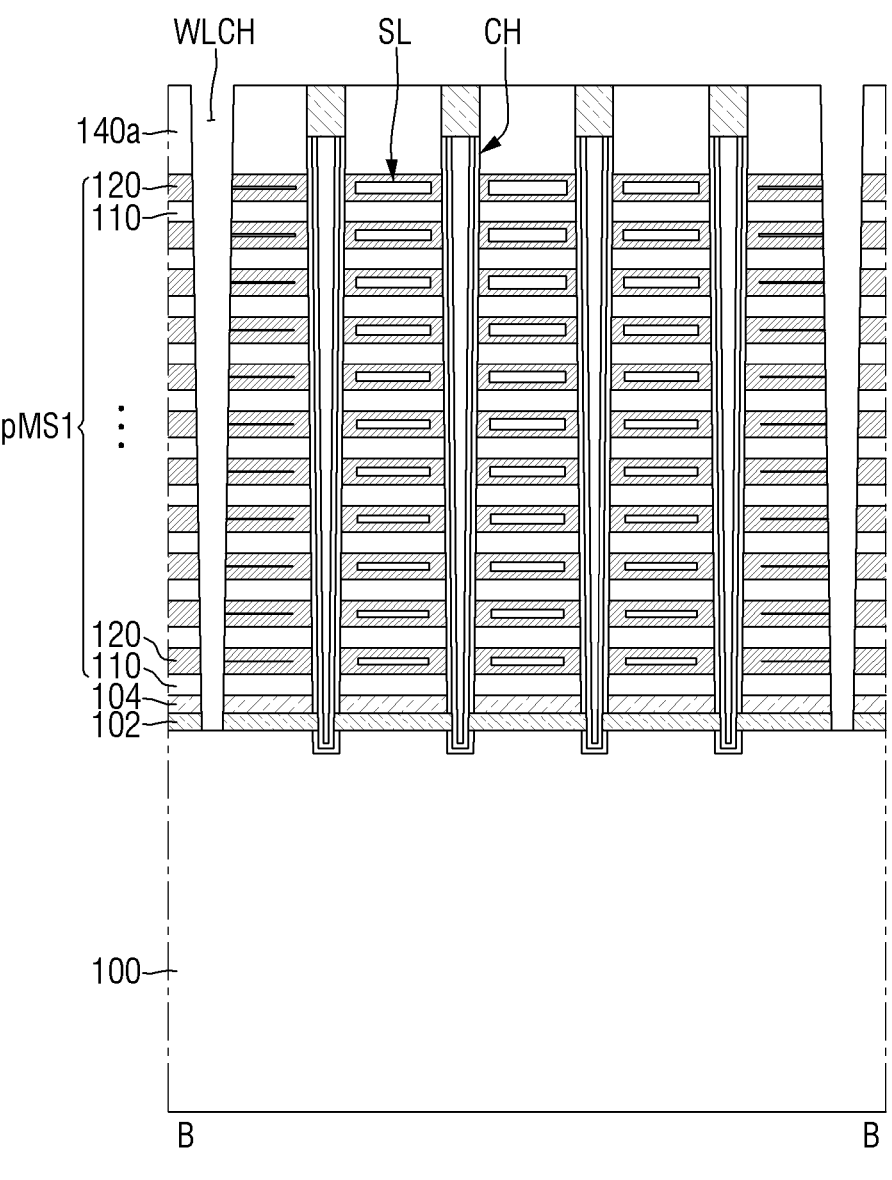
Figure 19:
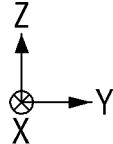

FIGS. 18 and 19 are intermediate stages in a method for manufacturing a semiconductor memory device according to some embodiments.

Referring to FIG. 18, a first preliminary mold pMS1 may be formed on the cell substrate 100. The first preliminary mold pMS1 may be formed on the front side of the cell substrate 100. The first preliminary mold pMS1 may include a plurality of mold sacrificial films 115 and a plurality of mold insulating films 110 that are alternately stacked on the cell substrate 100.

The mold sacrificial film 115 may include a material having an etching selectivity with respect to the mold insulating film 110. As an example, the mold insulating film 110 may include silicon oxide, and the mold sacrificial film 112 may include silicon nitride.

In some embodiments, a source sacrificial film 103 and a second source layer 104 may be formed on the cell substrate 100 before forming the first preliminary mold pMS1. The source sacrificial film 103 may include a material having an etching selectivity with respect to the mold insulating film 110. The second source layer 104 may include, e.g., impurity-doped polysilicon or impurity-undoped polysilicon.

The first interlayer insulating film 140a may be formed on the first preliminary mold pMS1. For example, the first preliminary mold pMS1 may be formed between the source sacrificial film 103 and the first interlayer insulating film 140a.

Subsequently, the channel structures CH penetrating the first preliminary mold pMS1 and the first interlayer insulating film 140a may be formed. In some embodiments, the channel structure CH may penetrate the source sacrificial film 103 and the second source layer 104 to be, e.g., directly, connected to the cell substrate 100.

Subsequently, a block separation hole WLCH penetrating the first preliminary mold pMS1 and the first interlayer insulating film 140a may be formed. The block separation hole WLCH may penetrate the source sacrificial film 103 and the second source layer 104. The block separation hole WLCH may extend in the first direction X and the third direction Z and cut the first preliminary mold pMS1.

Referring to FIG. 19, the mold sacrificial films 115 may be removed through the block separation hole WLCH. Since the mold sacrificial films 115 have an etching selectivity with respect to the mold insulating films 110, the mold sacrificial films 115 may be selectively removed (while the mold insulating films 110 remain). Next, the first gate electrodes 120 may be formed in the regions from which the mold sacrificial films 115 had been removed.

In detail, the first gate electrodes 120 may be formed along the side walls of the mold insulating film 110 and the channel structure CH, such that slits SL may be formed inside the first gate electrodes 120. For example, referring to FIG. 19, the material of the first gate electrodes 120 may be deposited, e.g., conformally, in a thin and continuous layer in the empty spaces (defined by the removed mold sacrificial films 115) between the mold insulating films 110, e.g., along the side walls of the mold insulating films 110 and the side walls of the channel structures CH the face the empty spaces, such that centers of the empty centers are not filled to define the slits SL in the centers of the resultant first gate electrodes 120. In some embodiments, the slits SL may be formed inside the first gate electrodes 120 between the adjacent block separation holes WLCH and the channel structure CH, and between the channel structures CH adjacent to each other.

The size of the slit SL may increase as it goes away from the cell substrate 100, e.g., the thickness of the slits SL in the third direction Z may increase as a distance along the third direction Z from the cell substrate 100 increases. This may be due to, e.g., the fact that the width of the channel structure CH increases as it goes away from the cell substrate 100 and the distance between adjacent channel structures CH decreases. The size of the slit SL may increase as it goes away from the block separation hole WLCH, e.g., the thickness of the slits SL in the third direction Z may increase as a distance along the second direction Y from the block separation hole WLCH increases.

For example, the first gate electrodes 120 may be formed by an atomic layer deposition (ALD) process. The ALD process includes a supply process of a source gas and a supply process of a reaction gas, e.g., sequential supply processes of a source gas and a reaction gas, and may further include a process in which a purge gas is injected after each of the supply processes. The aforementioned processes, e.g., steps, form a single deposition cycle, and the deposition cycle may be repeatedly performed. The source gas may include a precursor including the material constituting the first gate electrode 120. In some embodiments, the first gate electrode 120 may include molybdenum (Mo), and the precursor may include at least one of, e.g., $MoCl_5$, $MoO_2Cl_2$, $MoF_6$, and an organic metal.

In another example, the first gate electrodes 120 may be formed by a chemical vapor deposition (CVD) process. In the CVD process, the source gas and the reaction gas may be charged at the same time, e.g., simultaneously. In some embodiments, the first gate electrode 120 may include molybdenum (Mo), and the source gas may include at least one of $MoCl_5$, $MoO_2Cl_2$, $MoF_6$, and an organic metal.

In addition, the source sacrificial film 103 may be removed through the block separation hole WLCH. Since the source sacrificial film 103 has an etching selectivity with respect to the mold insulating film 110, it may be selectively removed. At this time, a part of the channel structure CH may be etched through the block separation hole WLCH. Next, the first source layer 102 that replaces the region from which the source sacrificial film 103 is removed may be formed. The first source layer 102 may come into contact with the semiconductor pattern (130 of FIG. 9) of the channel structure CH.

Next, referring to FIG. 10, the annealing process may be performed. At this time, the temperature at which the annealing process is performed may be about one-third of the melting point of the first gate electrode 120. For example, the temperature may be about 750° C. or higher. Accordingly, the grains of the first gate electrode 120 may be merged.

In detail, since slits SL closest to the block separation hole WLCH have a small size, the void 300 may not be formed inside, while the grains are merged, e.g., slits SL adjacent to the block separation hole WLCH may be completely sealed during the annealing process due to grain merging. However, slits SL between adjacent channel structures CH, i.e., slits SL having a bigger size compared to those adjacent to the block separation hole WLCH, may only partially seal, thereby forming the voids 300. That is, the voids 300 may be formed inside the slits SL between the adjacent channel structures CH, while the grains are merged by the annealing process, e.g., the voids 300 may be formed as empty spaces that are not completely merged by molybdenum grains during the annealing process. For example, each void 300 may be an empty space having a width and a height smaller than the width and the height of a corresponding slit SL. Depending on the size of the slit SL, the size of the void 300 may increase as it goes away from the cell substrate 100 and/or as it goes away from the block separation hole WLCH. Accordingly, the first mold structure MS1 may be formed. For example, the slits SL adjacent to the block separation hole WLCH may have smaller sizes than those between adjacent channel structures CH due to the larger width of the block separation hole WLCH, e.g., as compared to the opening for the channel structures CH, so the empty spaces for the first gate electrodes 120 adjacent to the block separation hole WLCH may be smaller, thereby having less space for the slits SL.

If slits were to remain inside the first gate electrodes 120 adjacent to the block separation hole WLCH after annealing, the grain of the first gate electrodes 120 would have separated on the basis of the slit (e.g., into upper and lower parts), thereby increasing the resistance due to scattering of electron on the surface. Further, the upper and lower parts of the first gate electrode 120 would have decreased the thickness of the first gate electrode 120, thereby further increasing the resistance of the first gate electrode 120.

In contrast, according to example embodiments, since the grains of the first gate electrode 120 adjacent to the block separation hole WLCH are completely merged, e.g., to completely eliminate the slits, the thickness of the first gate electrode 120 increases, thereby decreasing the resistance of the first gate electrode 120. Further, the resistance due to scattering of electrons may also decrease on the surface. Alternatively, the grains of the first gate electrode 120 may be merged by heat budget due to a manufacturing process to be performed subsequently, without performing another annealing process.

Next, the block separation structure WLC that fills the block separation hole WLCH may be formed. Subsequently, the bit line BL, the bit line contact 182, and the upper inter-wiring insulating film 142 may be formed.

Figure 20:
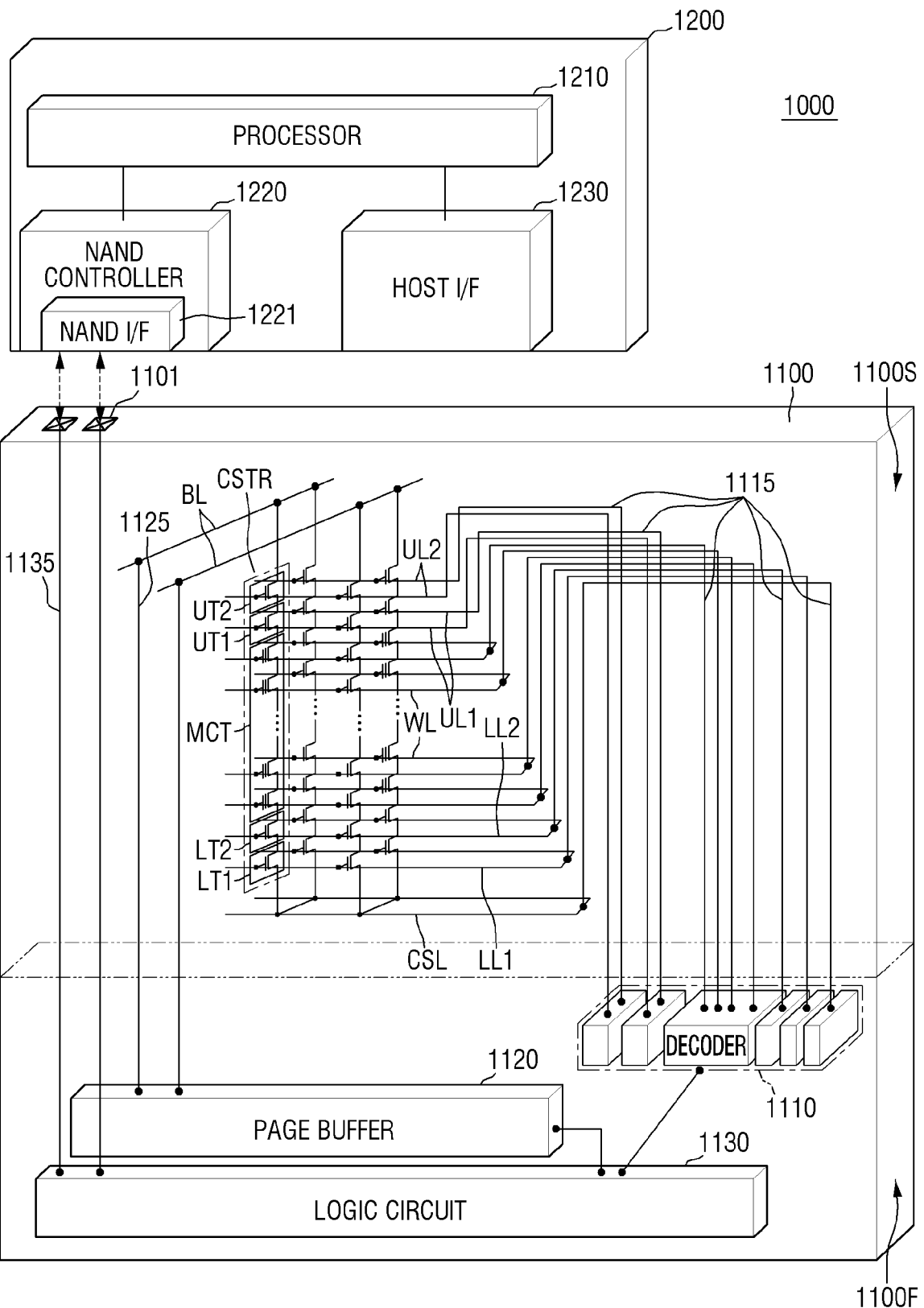
FIG. 20 is a schematic block diagram of an electronic system according to some embodiments.

FIG. 20 is an exemplary block diagram of an electronic system according to some embodiments.

Referring to FIG. 20, an electronic system 1000 according to some embodiments may include a semiconductor memory device 1100, and a controller 1200 that is electrically connected to the semiconductor memory device 1100. The electronic system 1000 may be a storage device that includes one or multiple semiconductor memory devices 1100, or an electronic device that includes the storage device. For example, the electronic system 1000 may be a solid state drive (SSD) device, a universal serial bus (USB), a computing system, a medical device or a communication device that includes one or multiple semiconductor memory devices 1100.

The semiconductor memory device 1100 may be a non-volatile memory device (e.g., a NAND flash memory device), and may be, e.g., the semiconductor memory device explained above with reference to FIGS. 1 to 17. The semiconductor memory device 1100 may include a first structure 1100F, and a second structure 1100S on the first structure 1100F. In the exemplary embodiments, the first structure 1100F may also be placed next to the second structure 1100S. The first structure 1100F may be a peripheral circuit structure that includes a decoder circuit 1110, a page buffer 1120, and a logic circuit 1130. The second structure 1100S may be a memory cell structure that includes the bit line BL, the common source line CSL, the word lines WL, first and second gate upper lines UL1 and UL2, first and second gate lower lines LL1 and LL2, and the memory cell strings CSTR between the bit line BL and the common source line CSL.

In the second structure 1100S, each memory cell string CSTR may include lower transistors LT1 and LT2 adjacent to the common source line CSL, upper transistors UT1 and UT2 adjacent to the bit line BL, and a plurality of memory cell transistors MCT placed between the lower transistors LT1 and LT2 and the upper transistors UT1 and UT2. The number of lower transistors LT1 and LT2 and the number of upper transistors UT1 and UT2 may be variously changed depending on the embodiments.

In the exemplary embodiments, the upper transistors UT1 and UT2 may include a string selection transistor, and the lower transistors LT1 and LT2 may include a ground selection transistor. The gate lower lines LL1 and LL2 may be gate electrodes of the lower transistors LT1 and LT2, respectively. The word lines WL may be gate electrodes of the memory cell transistors MCT, and the gate upper lines UL1 and UL2 may be gate electrodes of the upper transistors UT1 and UT2, respectively.

The common source line CSL, the first and second gate lower lines LL1 and LL2, the word lines WL, and the first and second gate upper lines UL1 and UL2 may be electrically connected to the decoder circuit 1110 through first connection wirings 1115 that extend from the inside of the first structure 1100F to the second structure 1100S. The bit lines BL may be electrically connected to the page buffer 1120 through second connection wirings 1125 that extend from the inside of the first structure 1100F to the second structure 1100S.

In the first structure 1100F, the decoder circuit 1110 and the page buffer 1120 may execute the control operation on at least one selection memory cell transistor among the plurality of memory cell transistors MCT. The decoder circuit 1110 and the page buffer 1120 may be controlled by the logic circuits 1130. The semiconductor memory device 1100 may communicate with the controller 1200 through an I/O pad 1101 that is electrically connected to the logic circuit 1130. The I/O pad 1101 may be electrically connected to the logic circuit 1130 through an I/O connection wiring 1135 extending from the inside of the first structure 1100F to the second structure 1100S.

The controller 1200 may include a processor 1210, a NAND controller 1220, and a host interface 1230. In some embodiments, the electronic system 1000 may include a plurality of semiconductor memory devices 1100, and in this case, the controller 1200 may control the plurality of semiconductor memory devices 1100.

The processor 1210 may control the operation of the overall electronic system 1000 including the controller 1200. The processor 1210 may operate according to a predetermined firmware, and may control the NAND controller 1220 to access the semiconductor memory device 1100. The NAND controller 1220 may include a NAND interface 1221 that processes communication with the semiconductor memory device 1100. Control command for controlling the semiconductor memory device 1100, data to be recorded in the memory cell transistors MCT of the semiconductor memory device 1100, data to be read from the memory cell transistors MCT of the semiconductor memory device 1100, and the like may be transmitted through the NAND interface 1221. The host interface 1230 may provide a communication function between the electronic system 1000 and an external host. When receiving the control command from the external host through the host interface 1230, the processor 1210 may control the semiconductor memory device 1100 in response to the control command.

Figure 21:
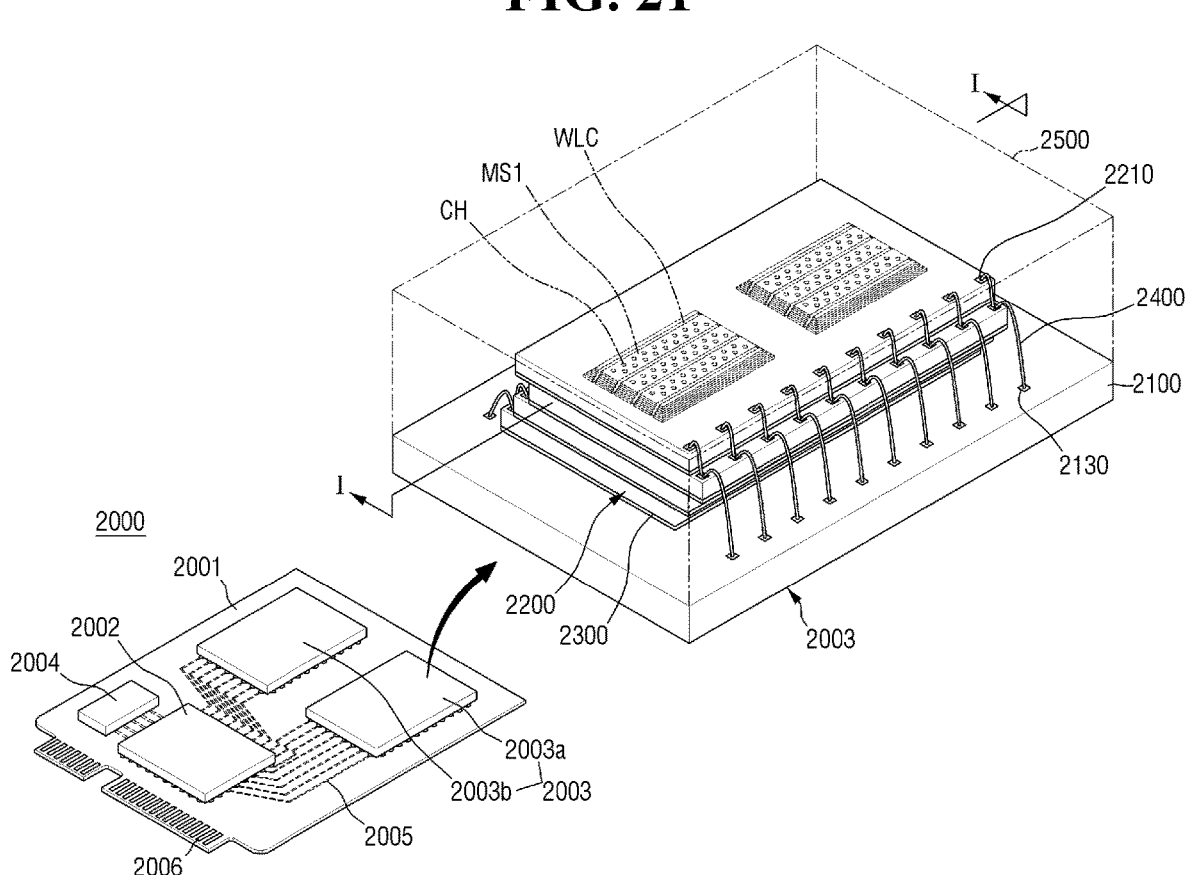
FIG. 21 is an exemplary perspective view of an electronic system according to some embodiments.

FIG. 21 is an exemplary perspective view of an electronic system according to some embodiments.

Referring to FIG. 21, an electronic system 2000 according to some embodiments may include a main board 2001, a main controller 2002 mounted on the main board 2001, one or more semiconductor packages 2003, and a dynamic random-access memory (DRAM) 2004. The semiconductor package 2003 and the DRAM 2004 may be connected to the main controller 2002 by wiring patterns 2005 formed on the main board 2001.

The main board 2001 may include a connector 2006 including a plurality of pins coupled to an external host. In the connector 2006, the number and arrangement of the plurality of pins may vary depending on the communication interface between the electronic system 2000 and the external host. In some embodiments, the electronic system 2000 may communicate with the external host according to any one of, e.g., M-Phy for USB, PCI-Express (Peripheral Component Interconnect Express), SATA (Serial Advanced Technology Attachment), and UFS (Universal Flash Storage). In some embodiments, the electronic system 2000 may operate by power supplied from the external host through the connector 2006. The electronic system 2000 may further include a PMIC (Power Management Integrated Circuit) that distributes the power supplied from the external host to the main controller 2002 and the semiconductor package 2003.

The main controller 2002 may record data in the semiconductor package 2003 or read data from the semiconductor package 2003, and may improve the operating speed of the electronic system 2000.

The DRAM 2004 may be a buffer memory for relieving a speed difference between the semiconductor package 2003, which is a data storage space, and the external host. The DRAM 2004 included in the electronic system 2000 may also operate as a kind of cache memory, and may also provide a space for temporarily storing data in the control operation on the semiconductor package 2003. When the DRAM 2004 is included in the electronic system 2000, the main controller 2002 may further include a DRAM controller for controlling the DRAM 2004, in addition to a NAND controller for controlling the semiconductor package 2003.

The semiconductor package 2003 may include a first semiconductor package 2003a and a second semiconductor package 2003b that are spaced apart from each other. The first semiconductor package 2003a and the second semiconductor package 2003b may each be a semiconductor package that includes a plurality of semiconductor chips 2200. The first semiconductor package 2003a and the second semiconductor package 2003b may each include a package substrate 2100, the semiconductor chips 2200 on the package substrate 2100, adhesive layers 2300 placed on the lower sides of each of the semiconductor chips 2200, a connecting structure 2400 for electrically connecting the semiconductor chips 2200 and the package substrate 2100, and a molding layer 2500 that covers the semiconductor chips 2200 and the connecting structure 2400 on the package substrate 2100.

The package substrate 2100 may be a printed circuit board that includes upper pads 2130. Each semiconductor chip 2200 may include an I/O pad 2210. The I/O pad 2210 may correspond to the I/O pad 1101 of FIG. 20. Each of the semiconductor chips 2200 may include the first mold structure MS1 and the channel structure CH. Each of the semiconductor chips 2200 may include the semiconductor memory device described above with reference to FIGS. 1 to 17.

In some embodiments, the connecting structure 2400 may be a bonding wire that electrically connects the I/O pad 1101 and the package upper pads 2130. Therefore, in each of the first semiconductor package 2003a and the second semiconductor package 2003b, the semiconductor chips 2200 may be electrically connected to each other in a bonding wire manner, and may be electrically connected to the package upper pads 2130 of the package substrate 2100. In some embodiments, in each of the first semiconductor package 2003a and the second semiconductor package 2003b, the semiconductor chips 2200 may be electrically connected to each other by a connecting structure including a through electrode (Through Silicon Via, TSV) instead of the connecting structure 2400 of a bonding wire type.

In some embodiments, the main controller 2002 and the semiconductor chips 2200 may also be included in a single package. In some embodiments, the main controller 2002 and the semiconductor chips 2200 are mounted on a separate interposer board different from the main board 2001, and the main controller 2002 and the semiconductor chips 2200 may also be connected to each other by the wiring formed on the interposer board.

Figure 22:
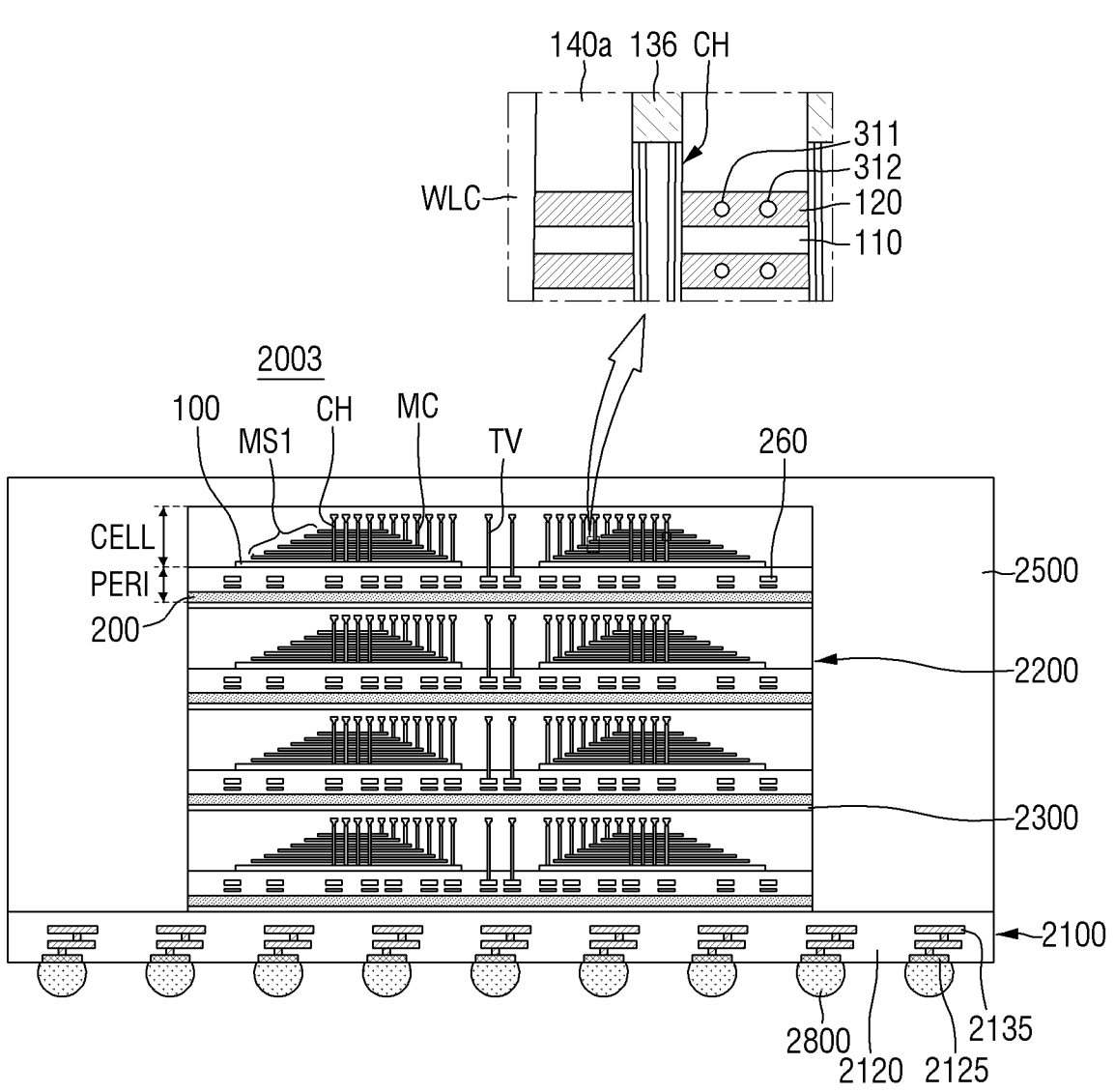
FIG. 22 is a cross-sectional view of a semiconductor packages according to some embodiments.

FIG. 22 is a cross-sectional view which schematically shows semiconductor packages according to some embodiments. FIG. 22 conceptually shows a region of the semiconductor package 2003 of FIG. 21 taken along I-I'.

Referring to FIG. 22, in some embodiments, the package substrate 2100 may be a printed circuit board. The package substrate 2100 may include a package substrate body portion 2120, package upper pads 2130 placed on an upper side of the package substrate body portion 2120, lower pads 2125 placed on a lower side of the package substrate body portion 2120 or exposed through the lower side, and inner wirings 2135 that electrically connect the upper pads 2130 and the lower pads 2125 inside the package substrate body portion 2120. The upper pads 2130 may be electrically connected to the connecting structure 2400. The lower pads 2125 may be connected to the wiring patterns 2005 of the main board 2001 of the electronic system 2000 through conductive connections 2800 as in FIG. 21.

Each of the semiconductor chips 2200 may include the semiconductor memory device described above with reference to FIGS. 1 to 17. For example, each of the semiconductor chips 2200 may include a peripheral circuit region PERI and a memory cell region CELL stacked on the peripheral circuit region PERI. As an example, the memory cell region CELL may include the cell substrate 100, the mold structures MS1 and MS2, the channel structure CH, the block separation structure WLC and the bit line BL described above with reference to FIGS. 1 to 17. Further, the memory cell region CELL may include gate connection wirings MC electrically connected to the gate electrodes 120 and 220 of the mold structures MS1 and MS2.

By way of summation and review, aspects of the present disclosure provide a semiconductor memory device having improved product reliability. Aspects of the present disclosure also provide an electronic system including the semiconductor memory device having improved product reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device, comprising:
a cell substrate including a cell array region and an extended region;
gate electrodes stacked on the cell substrate, the gate electrodes including molybdenum; and
channel structures in the cell array region, the channel structures penetrating the gate electrodes,
wherein;
at least one of the gate electrodes includes a plurality of voids arranged laterally in a region between a pair of laterally adjacent channel structures of the channel structures, and
each of the plurality of voids is an empty space.

2. The semiconductor memory device as claimed in claim 1, wherein a size of voids of the plurality of voids increases successively as a distance from the cell substrate increases.

3. The semiconductor memory device as claimed in claim 1, further comprising a block separation structure in the cell array region, the block separation structure penetrating the gate electrodes, and portions of the gate electrodes between the block separation structure and respective ones of the channel structures do not include any voids.

4. The semiconductor memory device as claimed in claim 3, wherein a size of voids of the plurality of voids increases successively as a distance from the block separation structure increases.

5. The semiconductor memory device as claimed in claim 1, further comprising dummy channel structures in the extended region, the dummy channel structures penetrating the gate electrodes, and portions of the gate electrodes between adjacent ones of the dummy channel structures do not include any voids.

6. The semiconductor memory device as claimed in claim 5, wherein a distance between adjacent ones of the dummy channel structures is greater than a distance between adjacent ones of the channel structures.

7. The semiconductor memory device as claimed in claim 1, wherein a width of the channel structures increases as a distance from the cell substrate increases.

8. The semiconductor memory device as claimed in claim 1, further comprising a string separation pattern in the cell array region, the string separation pattern penetrating only a subset of the gate electrodes wherein a portions of each gate electrodes of the subset of the gate electrodes between the string separation pattern and an adjacent one of the channel structures includes at least one void.

9. The semiconductor memory device as claimed in claim 1, further comprising a string separation pattern in the cell array region, the string separation pattern penetrating only a subset of the gate electrodes so that the string separation pattern is located between two voids located in one or more gate electrodes of the subset of the gate electrodes.

10. The semiconductor memory device as claimed in claim 1, further comprising a string separation pattern in the cell array region, the string separation pattern penetrating only some of the gate electrodes, wherein each of the some of the gate electrodes does not include any voids in a portion located between the string separation pattern and an adjacent one of the channel structures.

11. The semiconductor memory device as claimed in claim 1, further comprising:
a peripheral circuit board;
a wiring structure on the peripheral circuit board; and
an inter-wiring insulating film which covers the wiring structure on the peripheral circuit board, the cell substrate being stacked on the inter-wiring insulating film.

12. The semiconductor memory device as claimed in claim 1, further comprising a barrier layer which surrounds the gate electrodes.

13. The semiconductor memory device as claimed in claim 1, wherein each of the plurality of voids has a circular cross-sectional shape.

14. A semiconductor memory device, comprising:
a cell substrate;
first gate electrodes stacked on the cell substrate, the first gate electrodes extending in a first direction and including molybdenum;
second gate electrodes stacked on the first gate electrodes, the second gate electrodes extending in the first direction and including molybdenum;
channel structures penetrating the first gate electrodes and the second gate electrodes;
block separation structures penetrating the first gate electrodes and the second gate electrodes, the block separation structures extending in the first direction and being spaced apart from each other in a second direction different from the first direction; and
a first plurality of voids inside at least one of the first gate electrodes and a second plurality of voids inside at least one of the second gate electrodes, the first plurality of voids and second plurality of voids each arranged between adjacent ones of the channel structures, each void of the first and second plurality of voids being an empty space, and
wherein a region between one of the block separation structures and an adjacent one of the channel structures of the first and second gate electrodes is free of any voids,
wherein the channel structures include first to third channel structures arranged, in a top plan view, at vertices of a triangle, and
wherein, from the top plan view, a center of one of the first plurality of voids or a center of one of the second plurality of voids is at a center of the first to third channel structures.

15. The semiconductor memory device as claimed in claim 14, wherein:
the first plurality of voids includes a first void in an uppermost of the first gate electrodes and a second void in a lowermost of the first gate electrodes, a size of the first void being greater than a size of the second void, and
the second plurality of voids includes a third void in an uppermost of the second gate electrodes and a fourth void in a lowermost of the second gate electrodes, a size of the third void being greater than a size of the fourth void.

16. The semiconductor memory device as claimed in claim 14, further comprising a string separation pattern penetrating only some of the second gate electrodes between the block separation structures, wherein a portion of each of the some of the second gate electrodes between the string separation pattern and an adjacent one of the channel structures includes at least one void.

17. The semiconductor memory device as claimed in claim 14, further comprising a string separation pattern penetrating only a subset of the second gate electrodes between the block separation structures, wherein a portion of each gate electrode of the subset of the second gate electrodes between the string separation pattern and an adjacent one of the channel structures includes at least one void on at least one side wall of the string separation pattern.

18. The semiconductor memory device as claimed in claim 14, wherein a size of voids of the first plurality of voids or voids of the second plurality of voids increase successively as a distance from the block separation structures increases.

19. An electronic system, comprising:
a main board;
a semiconductor memory device on the main board, the semiconductor memory device including:
  a first structure including a peripheral circuit,
  a second structure including an I/O connection wiring electrically connected to the peripheral circuit, and
  an I/O pad electrically connected to the I/O connection wiring extending into the second structure; and
a controller electrically connected to the semiconductor memory device on the main board, wherein the second structure of the semiconductor memory device includes:
  a cell substrate including a cell array region and an extended region,
  gate electrodes stacked on the cell substrate, the gate electrodes including molybdenum,
  channel structures in the cell array region, the channel structures penetrating the gate electrodes, and
  a block separation structure that penetrates the gate electrodes, and
wherein at least one of the gate electrodes in a region between a pair of laterally adjacent channel structures of the channel structures includes a laterally arranged plurality of voids, each of the plurality of voids being an empty space, and a portion of each of the gate electrodes between the block separation structure and an adjacent one of the channel structures does not include any voids.

20. The electronic system as claimed in claim 19, wherein a size of voids of the plurality of voids increases successively as a distance from the cell substrate increases.

* * * * *